US011817505B2

(12) United States Patent
Yamazaki et al.

(10) Patent No.: US 11,817,505 B2
(45) Date of Patent: Nov. 14, 2023

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Masahiko Hayakawa, Atsugi (JP); Tatsuya Honda, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/686,736

(22) Filed: Mar. 4, 2022

(65) Prior Publication Data

US 2022/0293794 A1 Sep. 15, 2022

Related U.S. Application Data

(63) Continuation of application No. 16/731,582, filed on Dec. 31, 2019, now Pat. No. 11,271,115, which is a
(Continued)

(30) Foreign Application Priority Data

Oct. 19, 2011 (JP) ................................. 2011-230126

(51) Int. Cl.
*H01L 27/00* (2006.01)
*H01L 29/00* (2006.01)
(Continued)

(52) U.S. Cl.
CPC .... *H01L 29/78606* (2013.01); *H01L 27/1225* (2013.01); *H01L 27/14616* (2013.01);
(Continued)

(58) Field of Classification Search
CPC ........... H01L 27/1225; H01L 27/14616; H01L 27/3262; H01L 29/78606; H01L 29/24;
(Continued)

(56) References Cited

U.S. PATENT DOCUMENTS 5,207,868 A 5/1993 Shinohara
5,380,397 A 1/1995 Fukuyama et al.
(Continued)

FOREIGN PATENT DOCUMENTS

CN 001979800 A 6/2007
CN 101174667 A 5/2008
(Continued)

OTHER PUBLICATIONS

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.
(Continued)

*Primary Examiner* — Nikolay K Yushin
(74) *Attorney, Agent, or Firm* — ROBINSON INTELLECTUAL PROPERTY LAW OFFICE; Eric J. Robinson

(57) ABSTRACT

When a semiconductor device including a transistor in which a gate electrode layer, a gate insulating film, and an oxide semiconductor film are stacked and a source and drain electrode layers are provided in contact with the oxide semiconductor film is manufactured, after the formation of the gate electrode layer or the source and drain electrode layers by an etching step, a step of removing a residue remaining by the etching step and existing on a surface of the gate electrode layer or a surface of the oxide semiconductor film and in the vicinity of the surface is performed. The surface density of the residue on the surface of the oxide semiconductor film or the gate electrode layer can be $1 \times 10^{13}$ atoms/cm$^2$ or lower.

9 Claims, 10 Drawing Sheets

Related U.S. Application Data continuation of application No. 15/480,746, filed on Apr. 6, 2017, now Pat. No. 10,535,776, which is a continuation of application No. 14/445,462, filed on Jul. 29, 2014, now Pat. No. 9,620,623, which is a continuation of application No. 13/651,911, filed on Oct. 15, 2012, now Pat. No. 8,809,855.

(51) Int. Cl.

| | | |
|---|---|---|
| *H01L 29/786* | (2006.01) | |
| *H01L 29/49* | (2006.01) | |
| *H01L 29/66* | (2006.01) | |
| *H01L 27/12* | (2006.01) | |
| *H01L 27/146* | (2006.01) | |
| *H01L 29/24* | (2006.01) | |
| *H01L 29/45* | (2006.01) | |
| *H10K 59/121* | (2023.01) | |
| *G02F 1/1368* | (2006.01) | |

(52) U.S. Cl.
CPC .............. *H01L 29/24* (2013.01); *H01L 29/45* (2013.01); *H01L 29/49* (2013.01); *H01L 29/66742* (2013.01); *H01L 29/66969* (2013.01); *H01L 29/7869* (2013.01); *H01L 29/78618* (2013.01); *H01L 29/78696* (2013.01); *G02F 1/1368* (2013.01); *G02F 2203/01* (2013.01); *G02F 2203/64* (2013.01); *H10K 59/1213* (2023.02)

(58) Field of Classification Search
CPC ... H01L 29/45; H01L 29/49; H01L 29/66742; H01L 29/66969; H01L 29/78618; H01L 29/7869; H01L 29/78696; H01L 27/12; H01L 27/146; H01L 29/786; G02F 1/1368; G02F 1/29; G02F 1/133514; G02F 2203/01; G02F 2203/64; G02F 2203/12; G02F 1/136277; G02F 1/1362; G02F 2203/66; H10K 59/1213; H10K 59/121; H10K 59/12
See application file for complete search history.

(56) References Cited

U.S. PATENT DOCUMENTS

| | | |
|---|---|---|
| 5,556,714 A | 9/1996 | Fukuyama et al. |
| 5,585,949 A | 12/1996 | Yamazaki et al. |
| 5,731,856 A | 3/1998 | Kim et al. |
| 5,744,864 A | 4/1998 | Cillessen et al. |
| 5,770,100 A | 6/1998 | Fukuyama et al. |
| 5,837,614 A | 11/1998 | Yamazaki et al. |
| 5,866,932 A | 2/1999 | Yamazaki et al. |
| 6,100,562 A | 8/2000 | Yamazaki et al. |
| 6,177,302 B1 | 1/2001 | Yamazaki et al. |
| 6,291,085 B1 | 9/2001 | White et al. |
| 6,294,274 B1 | 9/2001 | Kawazoe et al. |
| 6,329,298 B1 | 12/2001 | Fukuyama et al. |
| 6,342,313 B1 | 1/2002 | White et al. |
| 6,410,162 B1 | 6/2002 | White et al. |
| 6,475,825 B2 | 11/2002 | White et al. |
| 6,563,174 B2 | 5/2003 | Kawasaki et al. |
| 6,610,141 B2 | 8/2003 | White et al. |
| 6,727,522 B1 | 4/2004 | Kawasaki et al. |
| 6,956,237 B2 * | 10/2005 | Oh .................. H01L 27/1262 |
| | | 257/E29.295 |
| 7,033,435 B2 | 4/2006 | White et al. |
| 7,049,190 B2 | 5/2006 | Takeda et al. |
| 7,061,014 B2 | 6/2006 | Hosono et al. |
| 7,061,565 B2 | 6/2006 | Kwon et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,517,464 B2 | 4/2009 | Matsushita et al. |
| 7,557,416 B2 | 7/2009 | Tsubata et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,737,923 B2 | 6/2010 | Shishido |
| 7,791,072 B2 | 9/2010 | Kumomi et al. |
| 7,893,509 B2 | 2/2011 | Tsubata et al. |
| 7,923,723 B2 | 4/2011 | Hayashi et al. |
| 7,964,868 B2 | 6/2011 | Nakagawa et al. |
| 8,067,768 B2 | 11/2011 | Yoon et al. |
| 8,115,201 B2 | 2/2012 | Yamazaki et al. |
| 8,158,517 B2 | 4/2012 | Yamamoto et al. |
| 8,164,090 B2 | 4/2012 | Iwasaki et al. |
| 8,193,031 B2 | 6/2012 | Hosoba et al. |
| 8,236,627 B2 | 8/2012 | Tsubuku et al. |
| 8,247,965 B2 | 8/2012 | Yamazaki et al. |
| 8,269,218 B2 | 9/2012 | Yamazaki |
| 8,274,079 B2 | 9/2012 | Yamazaki |
| 8,293,594 B2 | 10/2012 | Yamazaki et al. |
| 8,293,595 B2 | 10/2012 | Yamazaki et al. |
| 8,319,216 B2 | 11/2012 | Akimoto et al. |
| 8,343,817 B2 | 1/2013 | Miyairi et al. |
| 8,344,373 B2 | 1/2013 | Sato et al. |
| 8,344,374 B2 | 1/2013 | Yamazaki et al. |
| 8,367,448 B2 | 2/2013 | Choi et al. |
| 8,427,595 B2 | 4/2013 | Yamazaki et al. |
| 8,431,927 B2 | 4/2013 | Kim et al. |
| 8,492,760 B2 | 7/2013 | Yamazaki et al. |
| 8,502,220 B2 | 8/2013 | Yamazaki et al. |
| 8,513,661 B2 | 8/2013 | Takahashi et al. |
| 8,514,340 B2 | 8/2013 | Kwon et al. |
| 8,546,181 B2 | 10/2013 | Yamazaki |
| 8,547,753 B2 | 10/2013 | Takemura et al. |
| 8,551,824 B2 | 10/2013 | Yamazaki et al. |
| 8,563,356 B2 | 10/2013 | Cheong et al. |
| 8,581,243 B2 | 11/2013 | Takahashi et al. |
| 8,597,992 B2 | 12/2013 | Sasagawa et al. |
| 8,624,237 B2 | 1/2014 | Yamazaki et al. |
| 8,629,441 B2 | 1/2014 | Yamazaki et al. |
| 8,637,863 B2 | 1/2014 | Yamazaki |
| 8,674,354 B2 | 3/2014 | Yamazaki |
| 8,743,030 B2 | 6/2014 | Shishido |
| 8,760,931 B2 | 6/2014 | Takemura et al. |
| 8,809,857 B2 | 8/2014 | Cheong et al. |
| 8,841,710 B2 | 9/2014 | Yamazaki et al. |
| 8,878,180 B2 | 11/2014 | Yamazaki |
| 8,921,857 B2 | 12/2014 | Moriwaki |
| 9,000,438 B2 | 4/2015 | Jintyou. et al. |
| 9,054,206 B2 | 6/2015 | Yamazaki et al. |
| 9,070,596 B2 | 6/2015 | Yamazaki |
| 9,202,851 B2 | 12/2015 | Yamazaki et al. |
| 9,202,923 B2 | 12/2015 | Yamazaki |
| 9,411,208 B2 | 8/2016 | Yamazaki |
| 9,412,798 B2 | 8/2016 | Yamazaki et al. |
| 9,466,756 B2 | 10/2016 | Yamazaki et al. |
| 9,496,404 B2 | 11/2016 | Yamazaki et al. |
| 9,496,406 B2 | 11/2016 | Yamazaki et al. |
| 9,666,719 B2 | 5/2017 | Yamazaki et al. |
| 9,728,555 B2 | 8/2017 | Yamazaki |
| 9,859,441 B2 | 1/2018 | Yamazaki et al. |
| 9,911,625 B2 | 3/2018 | Yamazaki et al. |
| 9,927,654 B2 | 3/2018 | Jintyou. et al. |
| 9,991,288 B2 | 6/2018 | Yamazaki |
| 10,304,696 B2 | 5/2019 | Yamazaki et al. |
| 10,388,538 B2 | 8/2019 | Yamazaki et al. |
| 10,559,695 B2 | 2/2020 | Yamazaki et al. |
| 10,615,179 B2 | 4/2020 | Yamazaki |

(56) References Cited

U.S. PATENT DOCUMENTS

| | | |
|---|---|---|
| 11,101,295 B2 | 8/2021 | Yamazaki |
| 11,296,121 B2 | 4/2022 | Yamazaki et al. |
| 11,469,255 B2 | 10/2022 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0124451 A1* | 7/2004 | Oh .................. H01L 29/78603 257/E29.295 |
| 2004/0127038 A1 | 7/2004 | Carcia et al. |
| 2004/0134878 A1 | 7/2004 | Matsushita et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0175290 A1 | 8/2006 | Lee. et al. |
| 2006/0192907 A1 | 8/2006 | Kwon et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0022947 A1 | 2/2007 | White et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0122649 A1 | 5/2007 | Lee et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0179674 A1 | 7/2008 | Suzawa et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0047759 A1 | 2/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236597 A1 | 9/2009 | Ye |
| 2009/0278122 A1 | 11/2009 | Hosono et al. |
| 2009/0280600 A1 | 11/2009 | Hosono et al. |
| 2010/0025677 A1 | 2/2010 | Yamazaki et al. |
| 2010/0025678 A1 | 2/2010 | Yamazaki et al. |
| 2010/0051834 A1 | 3/2010 | Lopatin |
| 2010/0065844 A1 | 3/2010 | Tokunaga |
| 2010/0072467 A1 | 3/2010 | Yamazaki et al. |
| 2010/0072469 A1 | 3/2010 | Yamazaki et al. |
| 2010/0092800 A1 | 4/2010 | Itagaki et al. |
| 2010/0109002 A1 | 5/2010 | Itagaki et al. |
| 2010/0155719 A1 | 6/2010 | Sakata et al. |
| 2010/0219478 A1 | 9/2010 | Manabe et al. |
| 2010/0283049 A1 | 11/2010 | Sato et al. |
| 2010/0295037 A1 | 11/2010 | Hironaka |
| 2010/0295838 A1 | 11/2010 | Umezaki et al. |
| 2010/0320457 A1 | 12/2010 | Matsubara et al. |
| 2011/0006301 A1 | 1/2011 | Yamazaki et al. |
| 2011/0079784 A1 | 4/2011 | Im |
| 2011/0089416 A1 | 4/2011 | Yamazaki et al. |
| 2011/0156166 A1 | 6/2011 | Huang et al. |
| 2011/0207269 A1 | 8/2011 | Sasagawa et al. |
| 2011/0215325 A1 | 9/2011 | Yamazaki et al. |
| 2011/0215331 A1 | 9/2011 | Yamazaki et al. |
| 2011/0233541 A1 | 9/2011 | Yamazaki |
| 2011/0249229 A1 | 10/2011 | Kubota et al. |
| 2012/0122277 A1 | 5/2012 | Yamazaki et al. |
| 2012/0132906 A1 | 5/2012 | Yamazaki |
| 2012/0231581 A1 | 9/2012 | Yamazaki et al. |
| 2012/0235140 A1 | 9/2012 | Suzawa et al. |
| 2013/0037807 A1 | 2/2013 | Fukaya |
| 2013/0082253 A1 | 4/2013 | Yamazaki et al. |
| 2014/0252346 A1 | 9/2014 | Takemura et al. |
| 2016/0380111 A1 | 12/2016 | Yamazaki et al. |
| 2017/0005118 A1 | 1/2017 | Yamazaki et al. |
| 2019/0157461 A1 | 5/2019 | Yamazaki et al. |
| 2019/0279880 A1 | 9/2019 | Yamazaki et al. |
| 2020/0176606 A1 | 6/2020 | Yamazaki et al. |
| 2022/0115412 A1 | 4/2022 | Yamazaki et al. |
| 2023/0022290 A1 | 1/2023 | Yamazaki |

FOREIGN PATENT DOCUMENTS

| | | |
|---|---|---|
| CN | 101369541 A | 2/2009 |
| CN | 100555687 C | 10/2009 |
| CN | 101640221 A | 2/2010 |
| CN | 101645463 A | 2/2010 |
| CN | 101740631 A | 6/2010 |
| CN | 101952485 A | 1/2011 |
| CN | 102117767 A | 7/2011 |
| CN | 102160105 A | 8/2011 |
| EP | 0416774 A | 3/1991 |
| EP | 0809283 A | 11/1997 |
| EP | 1737044 A | 12/2006 |
| EP | 1764770 A | 3/2007 |
| EP | 1843404 A | 10/2007 |
| EP | 2175493 A | 4/2010 |
| EP | 2226847 A | 9/2010 |
| EP | 2445011 A | 4/2012 |
| EP | 2546884 A | 1/2013 |
| JP | 60-198861 A | 10/1985 |
| JP | 60-218847 A | 11/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-147321 A | 6/1991 |
| JP | 04-120282 A | 4/1992 |
| JP | 04-261018 A | 9/1992 |
| JP | 05-251705 A | 9/1993 |
| JP | 08-264794 A | 10/1996 |
| JP | 11-505377 | 5/1999 |

(56) References Cited

FOREIGN PATENT DOCUMENTS

| | | |
|---|---|---|
| JP | 11-224877 A | 8/1999 |
| JP | 2000-044236 A | 2/2000 |
| JP | 2000-150900 A | 5/2000 |
| JP | 2002-076356 A | 3/2002 |
| JP | 2002-110658 A | 4/2002 |
| JP | 2002-185000 A | 6/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-177946 A | 6/2004 |
| JP | 2004-273614 A | 9/2004 |
| JP | 2004-273732 A | 9/2004 |
| JP | 2005-086090 A | 3/2005 |
| JP | 2005-167019 A | 6/2005 |
| JP | 2007-073558 A | 3/2007 |
| JP | 2007-108733 A | 4/2007 |
| JP | 2007-134691 A | 5/2007 |
| JP | 2007-220816 A | 8/2007 |
| JP | 2009-194351 A | 8/2009 |
| JP | 2010-056540 A | 3/2010 |
| JP | 2010-056542 A | 3/2010 |
| JP | 2010-056546 A | 3/2010 |
| JP | 2010-097212 A | 4/2010 |
| JP | 2010-128323 A | 6/2010 |
| JP | 2010-245118 A | 10/2010 |
| JP | 2010-272663 A | 12/2010 |
| JP | 2011-077116 A | 4/2011 |
| JP | 2011-124532 A | 6/2011 |
| JP | 2011-139047 A | 7/2011 |
| JP | 2011-172214 A | 9/2011 |
| JP | 2011-181801 A | 9/2011 |
| JP | 2011-181913 A | 9/2011 |
| JP | 2011-192973 A | 9/2011 |
| JP | 2011-197653 A | 10/2011 |
| JP | 2011-199272 A | 10/2011 |
| JP | 2011-205078 A | 10/2011 |
| JP | 2011-205081 A | 10/2011 |
| KR | 0155380 | 12/1998 |
| KR | 10-0883769 | 2/2009 |
| KR | 2010-0039806 A | 4/2010 |
| KR | 2011-0003801 A | 1/2011 |
| KR | 10-1050466 | 7/2011 |
| KR | 2011-0095830 A | 8/2011 |
| KR | 2013-0008037 A | 1/2013 |
| TW | 201001710 | 1/2010 |
| TW | 201123460 | 7/2011 |
| TW | 201133788 | 10/2011 |
| TW | 201133789 | 10/2011 |
| WO | WO-2000/008691 | 2/2000 |
| WO | WO-2001/043165 | 6/2001 |
| WO | WO-2004/114391 | 12/2004 |
| WO | WO-2008/139859 | 11/2008 |
| WO | WO-2009/093722 | 7/2009 |
| WO | WO-2010/032639 | 3/2010 |
| WO | WO-2010/147032 | 12/2010 |
| WO | WO-2011/039853 | 4/2011 |
| WO | WO-2011/068032 | 6/2011 |
| WO | WO-2011/089808 | 7/2011 |
| WO | WO-2011/096263 | 8/2011 |
| WO | WO-2011/105184 | 9/2011 |
| WO | WO-2011/108381 | 9/2011 |
| WO | WO-2011/108382 | 9/2011 |
| WO | WO-2011/111781 | 9/2011 |

OTHER PUBLICATIONS

Dembo.H et al., "RFCPUS On Glass and Plastic Substrates Fabricated By TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven By the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS On Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission Amoled Display On Plastic Film and Its Bending Properties", SID Digest '09 : SID International Symposium Digest of Technical Papers, May 31, 2009, pp. 983-985.
Sakata.J et al., "Development of 4.0-IN. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide Tfts and Their Application for Large Size AMOLED", AM-FPD '08 Digest of Technical Papers, Jul. 2, 2008, pp. 275-278.
Park.S et al., "Challenge To Future Displays: Transparent AM-OLED Driven By Peald Grown ZNO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis On Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "Suftla Flexible Microelectronics On Their Way To Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status Of, Challenges To, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,Or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure To Water", Appl. Phys. Lett. (Applied Physics Letters) 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198- 200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.

(56) References Cited

OTHER PUBLICATIONS

Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor On SrTiO3 With Sputtered Al2O3 Gate Insulator", Appl. Phys. Lett. (Applied Physics Letters), Sep. 1, 2003, vol. 83, No. 9, pp. 1755-1757.
Chinese Office Action (Application No. 201210401500.7) dated Apr. 12, 2016.
Taiwanese Office Action (Application No. 105143625) dated Sep. 15, 2017.
Korean Office Action (Application No. 2012-0113059) dated Dec. 19, 2018.
Chinese Office Action (Application No. 201710588496.2) dated Jan. 10, 2020.
Chinese Office Action (Application No. 201710588496.2) dated Jun. 3, 2020.
Chinese Office Action (Application No. 201710588496.2) dated Oct. 27, 2020.

\* cited by examiner

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film (also referred to as a thin film transistor (TFT)) formed over a substrate having an insulating surface. The transistor is applied to a wide range of electronic devices such as an integrated circuit (IC) and an image display device (display device). A silicon-based semiconductor material is widely known as a material of the semiconductor thin film applicable to the transistor. As another material, an oxide semiconductor has been attracting attention.

For example, a transistor including a semiconductor layer formed of an amorphous oxide including indium (In), gallium (Ga), and zinc (Zn) (an In—Ga—Zn—O-based amorphous oxide) is disclosed (see Patent Document 1).

REFERENCE

Patent Document

[Patent Document 1] Japanese Published Patent Application No. 2011-181801

SUMMARY OF THE INVENTION

Improvement in reliability is important for commercialization of semiconductor devices including transistors that include an oxide semiconductor.

However, a semiconductor device includes a plurality of thin films complicatedly stacked, and is manufactured using a variety of materials, methods, and steps. Therefore, an employed manufacturing process may cause shape defects or a degradation of electrical characteristics of the semiconductor device.

In view of the above problem, it is an object to provide a highly reliable semiconductor device including a transistor using an oxide semiconductor.

It is another object to manufacture a highly reliable semiconductor device with high yield to improve productivity.

In a semiconductor device including an inverted staggered bottom-gate transistor according to an embodiment of the present invention, a surface of an oxide semiconductor film or a surface of a gate electrode layer and the vicinity thereof are prevented from being contaminated by a residue that remains by an etching step for forming a metal layer (the gate electrode layer or a source and drain electrode layers).

In the etching step for forming the metal layer such as the gate electrode layer or the source and drain electrode layers, a residue of an etchant (an etching gas or an etching solution) remains on a surface of the metal layer or a surface of the oxide semiconductor film and in the vicinity thereof. This residue causes a reduction or variation in electrical characteristics of the transistor, such as a decrease in withstand voltage of a gate insulating film or an increase in leakage current.

The residue includes the etchant (the etching gas or the etching solution), the processed metal layer, an element contained in the oxide semiconductor film which is exposed to the etchant, and a compound of such an element. For example, a gas including halogen is favorably used in the etching step for forming the metal layer such as the gate electrode layer or the source and drain electrode layers; in that case, the residue is a halogen impurity (halogen or a halide).

As the residue, chlorine, fluorine, boron, phosphorus, aluminum, iron, carbon, or the like can be given, for example. In addition, the residue may include a metal element (e.g., indium, gallium, or zinc) included in the oxide semiconductor film or the like, in some cases.

In an embodiment of a structure of the invention disclosed in this specification, after the source electrode layer and the drain electrode layer are formed, a step of removing the residue existing on the surface of the oxide semiconductor film and in the vicinity of the surface between the source electrode layer and the drain electrode layer (a residue removal step) is performed.

In another embodiment of the structure of the invention disclosed in this specification, after the gate electrode layer is formed, a step of removing the residue existing on the surface of the gate electrode layer (a residue removal step) is performed.

Treatment using water or an alkaline solution or plasma treatment can be performed as the residue removal step. Specifically, treatment using water or a tetramethylammonium hydroxide (TMAH) solution or plasma treatment using oxygen, dinitrogen monoxide, or a rare gas (typically argon) can be favorably used. Alternatively, treatment using dilute hydrofluoric acid may be used.

Since the surface of the oxide semiconductor film or the surface of the gate electrode layer and the vicinity of the surface can be prevented from being contaminated by the residue, in the semiconductor device including the inverted staggered bottom-gate transistor, the surface density of the residue (typically halogen (e.g., chlorine, fluorine), boron, phosphorus, aluminum, iron, or carbon) on the surface of the oxide semiconductor film (or the gate electrode layer) can be $1 \times 10^{13}$ atoms/cm$^2$ or lower (preferably $1 \times 10^{12}$ atoms/cm$^2$ or lower). Further, the concentration of the residue (typically halogen (e.g., chlorine, fluorine), boron, phosphorus, aluminum, iron, or carbon) on the surface of the oxide semiconductor film (or the gate electrode layer) can be $5 \times 10^{18}$ atoms/cm$^3$ or lower (preferably $1 \times 10^{18}$ atoms/cm$^3$ or lower).

Accordingly, a highly reliable semiconductor device including a transistor using an oxide semiconductor film and having stable electrical characteristics can be provided. In addition, the highly reliable semiconductor device can be manufactured with high yield, so that productivity can be improved.

An embodiment of the structure of the invention disclosed in this specification is a semiconductor device which includes a gate electrode layer over an insulating surface, a gate insulating film over the gate electrode layer, an oxide semiconductor film over the gate insulating film, a source electrode layer and a drain electrode layer over the oxide semiconductor film, and an insulating film which is in contact with a region of the oxide semiconductor film overlapping with the gate electrode layer and covers the source electrode layer and the drain electrode layer. In the semiconductor device, a surface of the oxide semiconductor film is in contact with the insulating film. The surface has a surface density of halogen of $1\times10^{13}$ atoms/cm$^2$ or lower.

Another embodiment of the structure of the invention disclosed in this specification is a semiconductor device which includes a gate electrode layer over an insulating surface, a gate insulating film over the gate electrode layer, an oxide semiconductor film over the gate insulating film, a source electrode layer and a drain electrode layer over the oxide semiconductor film, and an insulating film which is in contact with a region of the oxide semiconductor film overlapping with the gate electrode layer and covers the source electrode layer and the drain electrode layer. In the semiconductor device, a surface of the gate electrode layer has a surface density of halogen of $1\times10^{13}$ atoms/cm$^2$ or lower.

Another embodiment of the structure of the invention disclosed in this specification is a semiconductor device which includes a gate electrode layer over an insulating surface, a gate insulating film over the gate electrode layer, an oxide semiconductor film over the gate insulating film, a source electrode layer and a drain electrode layer over the oxide semiconductor film, and an insulating film which is in contact with a region of the oxide semiconductor film overlapping with the gate electrode layer and covers the source electrode layer and the drain electrode layer. In the semiconductor device, a surface of the oxide semiconductor film is in contact with the insulating film. The surface of the oxide semiconductor film has a surface density of halogen of $1\times10^{13}$ atoms/cm$^2$ or lower, and a surface of the gate electrode layer has a surface density of halogen of $1\times10^{13}$ atoms/cm$^2$ or lower.

Another embodiment of the structure of the invention disclosed in this specification is a method for manufacturing a semiconductor device which includes the steps of forming a gate electrode layer over an insulating surface, forming a gate insulating film over the gate electrode layer, forming an oxide semiconductor film over the gate insulating film, forming a conductive film over the oxide semiconductor film, forming a source electrode layer and a drain electrode layer by etching the conductive film using a gas including halogen, and performing a residue removal step on the oxide semiconductor film.

Another embodiment of the structure of the invention disclosed in this specification is a method for manufacturing a semiconductor device which includes the steps of forming a conductive film over an insulating surface, forming a gate electrode layer by etching the conductive film using a gas including halogen; performing a residue removal step on the gate electrode layer; forming a gate insulating film over the gate electrode layer after the step of performing the residue removal step on the gate electrode layer, forming an oxide semiconductor film over the gate insulating film, and forming a source electrode layer and a drain electrode layer over the oxide semiconductor film.

Another embodiment of the structure of the invention disclosed in this specification is a method for manufacturing a semiconductor device which includes the steps of forming a first conductive film over an insulating surface, forming a gate electrode layer by etching the first conductive film using a gas including halogen, performing a residue removal step on the gate electrode layer, forming a gate insulating film over the gate electrode layer after the step of performing the residue removal step on the gate electrode layer, forming an oxide semiconductor film over the gate insulating film, forming a second conductive film over the oxide semiconductor film, forming a source electrode layer and a drain electrode layer by etching the second conductive film using a gas including halogen, and performing a residue removal step on the oxide semiconductor film.

An embodiment of the present invention relates to a semiconductor device including a transistor or a semiconductor device including a circuit which is formed by using a transistor. For example, an embodiment of the present invention relates to a semiconductor device including a transistor in which a channel formation region is formed using an oxide semiconductor or a semiconductor device including a circuit which is formed by using such a transistor. For example, an embodiment of the present invention relates to an electronic device which includes, as a component, an LSI; a CPU; a power device mounted in a power circuit; a semiconductor integrated circuit including a memory, a thyristor, a converter, an image sensor, or the like; an electro-optical device typified by a liquid crystal display panel; or a light-emitting display device including a light-emitting element.

With an embodiment of the present invention, a highly reliable semiconductor device including a transistor using an oxide semiconductor is provided.

With an embodiment of the present invention, a highly reliable semiconductor device is manufactured with high yield, so that productivity is improved.

DETAILED DESCRIPTION OF THE INVENTION

Embodiments of the invention disclosed in this specification will be described below with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, an embodiment of a semiconductor device and a method for manufacturing the semiconductor device will be described with reference to FIGS. 1A to 1E. In this embodiment, a semiconductor device including a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
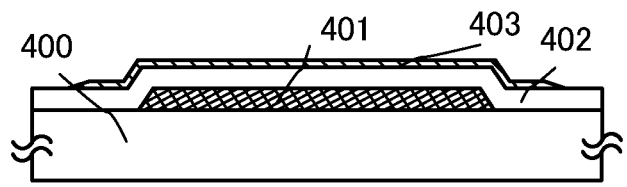
FIGS. 1A to 1E are cross-sectional views illustrating an embodiment of a semiconductor device and a method for manufacturing the semiconductor device.
Figure 1B:
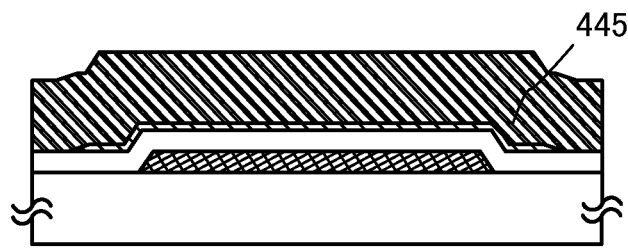
Figure 1C:
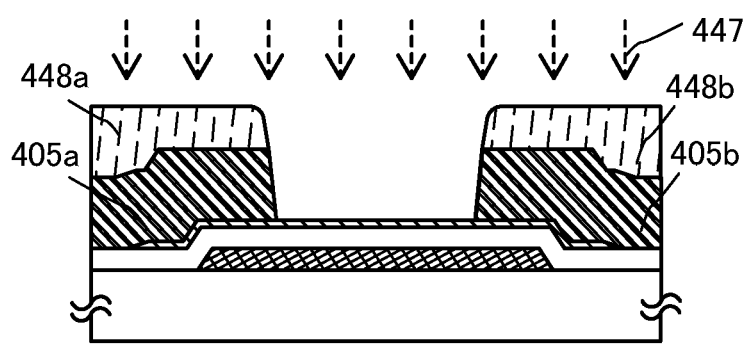
Figure 1D:
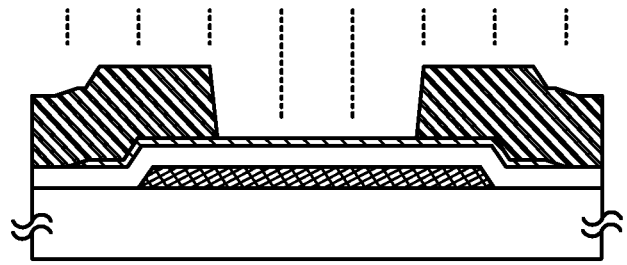
Figure 1E:
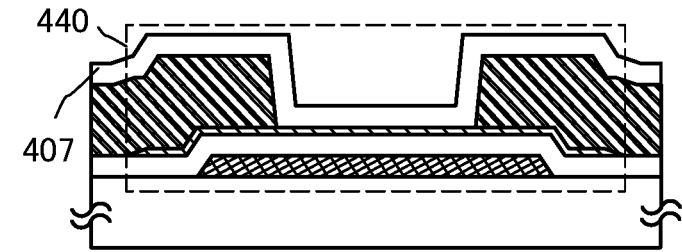

A transistor 440 illustrated in FIG. 1E is an example of an inverted staggered transistor that is one type of a bottom-gate transistor. Note that FIGS. 1A to 1E are cross-sectional views taken along a channel length direction of the transistor 440.

As illustrated in FIG. 1E, the semiconductor device including the transistor 440 includes, over a substrate 400 having an insulating surface, a gate electrode layer 401, a gate insulating film 402, an oxide semiconductor film 403, a source electrode layer 405a, and a drain electrode layer 405b. An insulating film 407 is provided to cover the transistor 440.

An oxide semiconductor used for the oxide semiconductor film 403 contains at least indium (In). In particular, In and zinc (Zn) are preferably contained. In addition, as a stabilizer for reducing variation in electrical characteristics of a transistor formed using the oxide semiconductor film, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

A material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio in the neighborhood of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio in the neighborhood of the above atomic ratios may be used.

However, without limitation to the materials given above, a material with an appropriate composition may be used as the oxide semiconductor containing indium depending on needed electrical characteristics (e.g., mobility, threshold voltage, and variation). In order to obtain the needed electrical characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can also be increased by reducing the defect density in a bulk in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The oxide semiconductor film 403 is in a single crystal state, a polycrystalline (also referred to as polycrystal) state, an amorphous state, or the like.

The oxide semiconductor film 403 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not necessarily clear. Further, with the TEM, a grain boundary is not observed in the CAAC-OS film. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°. Note that part of oxygen included in the oxide semiconductor film may be substituted with nitrogen.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in the impurity-added region becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal part such as the CAAC-OS film, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that $R_a$ is obtained by expanding arithmetic mean surface roughness, which is defined by JIS B 0601: 2001 (ISO4287: 1997), into three dimensions so as to be applied to a curved surface. $R_a$ can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x,y)-Z_0|dxdy \quad \text{[FORMULA 1]}$$

Here, the specific surface is a surface which is a target of roughness measurement, and is a quadrilateral region which is specified by four points represented by the coordinates $(x_1, y_1, y_1)$, $f(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the designated surface on the xy plane, and $Z_0$ represents the height of the reference surface (the average height of the designated surface). $R_a$ can be measured using an atomic force microscope (AFM).

In addition, the reference surface is a surface parallel to the xy plane at the average height of the designated surface. In short, when the average value of the height of the designated surface is denoted by $Z_0$, the height of the reference surface is also represented by $Z_0$.

Note that since the transistor 440 described in this embodiment is a bottom-gate transistor, the substrate 400, the gate electrode layer 401, and the gate insulating film 402 are located below the oxide semiconductor film. Accordingly, planarization treatment such as CMP (chemical mechanical polishing) treatment may be performed after the formation of the gate electrode layer 401 and the gate insulating film 402 to obtain the above flat surface.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where surfaces of a plurality of substrates are substantially perpendicular to a surface of a sputtering target.

An example of a method for manufacturing the semiconductor device including the transistor 440 is illustrated in FIGS. 1A to 1E.

There is no particular limitation on the substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

A flexible substrate may be used as the substrate 400 to manufacture the semiconductor device. To manufacture a flexible semiconductor device, the transistor 440 including the oxide semiconductor film 403 may be directly formed over a flexible substrate; or alternatively, the transistor 440 including the oxide semiconductor film 403 may be formed over a substrate and then may be separated and transferred to a flexible substrate. Note that in order to separate the transistor 440 from the manufacturing substrate and transfer it to the flexible substrate, a separation layer may be provided between the manufacturing substrate and the transistor 440 including the oxide semiconductor film.

As a base film, an insulating film may be provided over the substrate 400. The insulating film can be formed by a plasma CVD method, a sputtering method, or the like using an oxide insulating film of silicon oxide, silicon oxynitride, aluminum oxide, aluminum oxynitride, hafnium oxide, or gallium oxide; a nitride insulating film of silicon nitride, silicon nitride oxide, aluminum nitride, or aluminum nitride oxide; or a film of a mixed material of any of the above materials.

Heat treatment may be conducted on the substrate 400 (or both the substrate 400 and the insulating film). For example, the heat treatment may be conducted with a GRTA (gas rapid thermal annealing) apparatus that performs heat treatment using high-temperature gas, at 650° C. for 1 minute to 5 minutes. As the high-temperature gas used in GRTA, an inert gas which does not react with a processing object by the heat treatment, such as nitrogen or a rare gas like argon, is used. Alternatively, the heat treatment may be conducted with an electric furnace at 500° C. for 30 minutes to 1 hour.

Next, a conductive film is formed over the substrate 400 and is etched, so that the gate electrode layer 401 is formed. Note that the etching of the conductive film may be performed by dry etching, wet etching, or both of them.

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure.

The gate electrode layer 401 can also be formed using a conductive material such as indium oxide including tungsten oxide, indium oxide including titanium oxide, indium tin oxide, indium tin oxide including titanium oxide, indium tin oxide to which silicon oxide is added, indium zinc oxide, or indium zinc oxide including tungsten oxide. It is also possible that the gate electrode layer 401 has a stacked-layer structure of the above conductive material and the above metal material.

As the gate electrode layer 401 which is in contact with the gate insulating film 402, a metal oxide including nitrogen, specifically, an In—Ga—Zn-based oxide film including nitrogen, an In—Sn-based oxide film including nitrogen, an In—Ga-based oxide film including nitrogen, an In—Zn-based oxide film including nitrogen, a tin oxide film including nitrogen, an indium oxide film including nitrogen, or a metal nitride (InN, SnN, or the like) film can be used. These films each have a work function of 5 eV (electron volts) or higher, preferably 5.5 eV or higher, which enables the threshold voltage, which is one of electric characteristics of a transistor, to be positive when used as the gate electrode layer.

In this embodiment, a tungsten film with a thickness of 100 nm is formed by a sputtering method.

Heat treatment may be conducted on the substrate 400 and the gate electrode layer 401 after the formation of the gate electrode layer 401. For example, the heat treatment may be conducted with a GRTA apparatus at 650° C. for 1 minute to 5 minutes. Alternatively, the heat treatment may be conducted with an electric furnace at 500° C. for 30 minutes to 1 hour.

Next, the gate insulating film 402 is formed over the gate electrode layer 401.

To improve the coverage by the gate insulating film 402, planarization treatment may be performed on a surface of the gate electrode layer 401. In the case of using a thin insulating film as the gate insulating film 402 in particular, it is preferable that the flatness of the surface of the gate electrode layer 401 be good.

The gate insulating film 402 can be formed to have a thickness of greater than or equal to 1 nm and less than or equal to 20 nm by a sputtering method, an MBE method, a CVD method, a pulse laser deposition method, an ALD method, or the like as appropriate. The gate insulating film 402 may be formed with a sputtering apparatus that performs film formation with surfaces of a plurality of substrates set substantially perpendicular to a surface of a sputtering target.

A material of the gate insulating film 402 can be a silicon oxide film, a gallium oxide film, an aluminum oxide film, a silicon nitride film, a silicon oxynitride film, an aluminum oxynitride film, or a silicon nitride oxide film.

When the gate insulating film 402 is formed using a high-k material such as hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)), or lanthanum oxide, gate leakage current can be reduced. Further, the gate insulating film 402 may have either a single-layer structure or a stacked-layer structure.

It is preferable that the gate insulating film 402 include oxygen in a portion that is in contact with the oxide semiconductor film 403. In particular, the gate insulating film 402 preferably includes, in the film (bulk), an amount of oxygen which exceeds at least the amount of oxygen in the stoichiometric composition. For example, in the case where a silicon oxide film is used as the gate insulating film 402, the composition formula of the gate insulating film 402 is SiO$_{2+\alpha}$ ($\alpha$>0).

When the gate insulating film 402 including much (an excessive amount of) oxygen, which serves as an oxygen supply source, is provided in contact with the oxide semiconductor film 403, oxygen can be supplied from the gate insulating film 402 to the oxide semiconductor film 403. Heat treatment may be performed in the state where the oxide semiconductor film 403 is at least partly in contact with the gate insulating film 402, to supply oxygen to the oxide semiconductor film 403.

By supply of oxygen to the oxide semiconductor film 403, oxygen vacancies in the film can be filled. Further, the gate insulating film 402 is preferably formed in consideration of the size of the transistor and the step coverage by the gate insulating film 402.

In this embodiment, a silicon oxynitride film with a thickness of 200 nm is formed by a high-density plasma CVD method.

After the formation of the gate insulating film 402, heat treatment may be conducted on the substrate 400, the gate electrode layer 401, and the gate insulating film 402. For example, the heat treatment may be conducted with a GRTA apparatus at 650° C. for 1 minute to 5 minutes. Alternatively, the heat treatment may be conducted with an electric furnace at 500° C. for 30 minutes to 1 hour.

Next, the oxide semiconductor film 403 is formed over the gate insulating film 402 (see FIG. 1A).

In order that hydrogen or water will not enter the oxide semiconductor film 403 as much as possible in the formation step of the oxide semiconductor film 403, it is preferable to preheat the substrate provided with the gate insulating film 402 in a preheating chamber of a sputtering apparatus as a pretreatment for formation of the oxide semiconductor film 403, so that impurities such as hydrogen and moisture adsorbed onto the substrate and the gate insulating film 402 are eliminated and exhausted. As an exhaustion unit provided in the preheating chamber, a cryopump is preferable.

Planarization treatment may be performed on the region of the gate insulating film 402 which is to be in contact with the oxide semiconductor film 403. There is no particular limitation on the planarization treatment, and polishing treatment (e.g., CMP treatment), dry etching treatment, or plasma treatment can be used.

As the plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 402.

As the planarization treatment, polishing treatment, dry etching treatment, or plasma treatment may be performed a plurality of times, or these treatments may be performed in combination. In the case where the treatments are combined, the order of steps is not particularly limited and may be set as appropriate depending on the roughness of the surface of the gate insulating film 402.

The oxide semiconductor film 403 is preferably formed under conditions such that much oxygen is included during deposition (for example, by a sputtering method in an atmosphere where the proportion of oxygen is 100%) so as to be a film including much oxygen (preferably including a region that includes an excessive amount of oxygen that exceeds the amount of oxygen in the stoichiometric composition of the oxide semiconductor in a crystalline state).

In this embodiment, as the oxide semiconductor film 403, an In—Ga—Zn-based oxide film (an IGZO film) is formed with a thickness of 35 nm by a sputtering method using a sputtering apparatus that includes an AC power supply device. In this embodiment, an In—Ga—Zn-based oxide target with an atomic ratio of In:Ga:Zn=1:1:1 (=1/3:1/3:1/3) is used. The deposition conditions are as follows: the atmosphere is oxygen and argon (the flow rate of oxygen: 50%), the pressure is 0.6 Pa, the power supply is 5 kW, and the substrate temperature is 170° C. The deposition rate under these deposition conditions is 16 nm/min.

It is preferable that a high-purity gas from which an impurity such as hydrogen, water, a hydroxyl group, or hydride is removed be used as the sputtering gas for the deposition of the oxide semiconductor film 403.

The substrate is held in a deposition chamber kept under reduced pressure. Then, a sputtering gas from which hydrogen and moisture are removed is introduced into the deposition chamber while remaining moisture is removed from the deposition chamber, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$) (further preferably, also a compound containing a carbon atom), and the like are removed, whereby the concentration of impurities in the oxide semiconductor film 403 formed in the deposition chamber can be reduced.

Further, it is preferable to successively form the gate insulating film 402 and the oxide semiconductor film 403 without exposing the gate insulating film 402 to the air. The successive formation of the gate insulating film 402 and the oxide semiconductor film 403 without exposure of the gate insulating film 402 to the air can prevent impurities such as hydrogen and moisture from adsorbing onto the surface of the gate insulating film 402.

The oxide semiconductor film 403 can be formed by processing a film-shaped oxide semiconductor film into an island shape by a photolithography process.

A resist mask for forming the island-shaped oxide semiconductor film 403 may be formed by an inkjet method. Formation of the resist mask by an inkjet method needs no photomask and thus can reduce manufacturing cost.

Note that the etching of the oxide semiconductor film may be dry etching, wet etching, or both of them. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by dry etching using an inductively coupled plasma (ICP) etching method.

Further, heat treatment may be conducted on the oxide semiconductor film 403 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be conducted under reduced pressure, a nitrogen atmosphere, or the like.

In the case of using a crystalline oxide semiconductor film as the oxide semiconductor film 403, heat treatment for crystallization may be conducted.

In this embodiment, the substrate is introduced into an electric furnace which is one kind of heat treatment apparatuses, and the oxide semiconductor film 403 is subjected to heat treatment at 450° C. in a nitrogen atmosphere for 1 hour and then heat treatment at 450° C. in an atmosphere including nitrogen and oxygen for 1 hour.

Note that the heat treatment apparatus used is not limited to an electric furnace, and a device for heating a processing object by heat conduction or heat radiation from a heating element such as a resistance heating element may alternatively be used. For example, an RTA (rapid thermal annealing) apparatus such as a GRTA apparatus or an LRTA (lamp rapid thermal annealing) apparatus can be used. An LRTA apparatus is an apparatus for heating a processing object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a processing object by the heat treatment, such as nitrogen or a rare gas like argon, is used.

For example, as the heat treatment, GRTA may be conducted as follows. The substrate is put in an inert gas heated to high temperature of 650° C. to 700° C., is heated for several minutes, and is taken out of the inert gas.

Note that in the heat treatment, it is preferable that moisture, hydrogen, and the like be not contained in the atmosphere of nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity dinitrogen monoxide gas, or ultra dry air (air with a moisture amount of less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be introduced into the same furnace. It is preferable that water, hydrogen, and the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen which is a main component of the oxide semiconductor and which has been reduced at the same time as the step of removing impurities by the dehydration or dehydrogenation treatment is supplied, so that the oxide semiconductor film 403 can be a high-purity and electrically i-type (intrinsic) oxide semiconductor film.

The heat treatment for dehydration or dehydrogenation may be performed after the film-shaped oxide semiconductor film is formed, or after the island-shaped oxide semiconductor film 403 is formed.

The heat treatment for dehydration or dehydrogenation may be performed a plurality of times and may be combined with another heat treatment.

When the heat treatment for dehydration or dehydrogenation is performed in the state where the gate insulating film 402 is covered with the film-shaped oxide semiconductor film which has not been processed into the island-shaped oxide semiconductor film 403, oxygen included in the gate insulating film 402 can be prevented from being released by the heat treatment, which is preferable.

Oxygen (which includes at least one of an oxygen radical, an oxygen atom, and an oxygen ion) may be added to the dehydrated or dehydrogenated oxide semiconductor film 403 in order to supply oxygen to the oxide semiconductor film 403.

The dehydration or dehydrogenation treatment may be accompanied with elimination of oxygen which is a main component of an oxide semiconductor, that is, a reduction of oxygen in the oxide semiconductor. An oxygen vacancy exists in a portion where oxygen is eliminated in the oxide semiconductor film, and a donor level which leads to a change in the electrical characteristics of a transistor is formed owing to the oxygen vacancy.

For this reason, it is preferable to supply oxygen (which includes at least one of an oxygen radical, an oxygen atom, and an oxygen ion) to the dehydrated or dehydrogenated oxide semiconductor film. By supply of oxygen to the oxide semiconductor film, the oxygen vacancy in the film can be filled.

The addition and supply of oxygen to the dehydrated or dehydrogenated oxide semiconductor film 403 can increase the purity of the oxide semiconductor film 403 and make the oxide semiconductor film 403 electrically i-type (intrinsic). A transistor including the high-purity and electrically i-type (intrinsic) oxide semiconductor film 403 has suppressed variation in electrical characteristics and is electrically stable.

Oxygen can be added by an ion implantation method, an ion doping method, a plasma immersion ion implantation method, plasma treatment, or the like.

In the step of adding oxygen to the oxide semiconductor film 403, oxygen may be directly added to the oxide semiconductor film 403 or to the oxide semiconductor film 403 through another film such as the insulating film 407. An ion implantation method, an ion doping method, a plasma immersion ion implantation method, or the like may be employed for the addition of oxygen through another film, whereas plasma treatment or the like can be employed for the addition of oxygen directly to the exposed oxide semiconductor film 403.

The addition of oxygen to the oxide semiconductor film 403 is preferably performed after the dehydration or dehydrogenation treatment; however, the timing is not particularly limited. Further, oxygen may be added a plurality of times to the dehydrated or dehydrogenated oxide semiconductor film 403.

It is preferable that the oxide semiconductor film in the transistor include a region that includes an excessive amount of oxygen that exceeds the amount of oxygen in the stoichiometric composition of the oxide semiconductor in a crystalline state. In this case, the amount of oxygen in the region exceeds that in the stoichiometric composition of the oxide semiconductor. Alternatively, the amount of oxygen in the region exceeds that of the oxide semiconductor in a single crystal state. In some cases, oxygen may exist between lattices of the oxide semiconductor.

By removing hydrogen or moisture from the oxide semiconductor to purify the oxide semiconductor so as not to contain impurities as much as possible, and supplying oxygen to fill an oxygen vacancy, the oxide semiconductor can become an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film in a transistor, variation in the threshold voltage Vth of the transistor due to an oxygen vacancy and a shift of the threshold voltage $\Delta$Vth can be reduced.

Next, a conductive film 445 for forming a source electrode layer and a drain electrode layer (including a wiring formed of the same layer as the source electrode layer and the drain electrode layer) is formed over the gate electrode layer 401, the gate insulating film 402, and the oxide semiconductor film 403 (see FIG. 1B).

The conductive film 445 is formed of a material that can withstand heat treatment performed later. As the conductive film 445 used for forming the source electrode layer and the drain electrode layer, it is possible to use, for example, a metal film containing an element selected from Al, Cr, Cu, Ta, Ti, Mo, and W, a metal nitride film containing any of the above-mentioned elements as its component (a titanium nitride film, a molybdenum nitride film, or a tungsten nitride film), or the like. Alternatively, it is possible to use a structure in which a film of a high-melting-point metal such as Ti, Mo, or W or a metal nitride film thereof (e.g., a titanium nitride film, a molybdenum nitride film, or a tungsten nitride film) is stacked over and/or below a metal film such as an Al film or a Cu film. Further alternatively, a conductive metal oxide may be used as a material of the conductive film 445 used for forming the source electrode layer and the drain electrode layer. As the conductive metal oxide, indium oxide ($In_2O_3$), tin oxide ($SnO_2$), zinc oxide (ZnO), indium tin oxide ($In_2O_3$—$SnO_2$; abbreviated to ITO), indium zinc oxide ($In_2O_3$—ZnO), or any of these metal oxide materials containing silicon oxide can be used.

A resist mask 448a and a resist mask 448b are formed over the conductive film 445 by a photolithography process. Selective etching is performed using a gas 447 including halogen, so that the source electrode layer 405a and the drain electrode layer 405b are formed (see FIG. 1C). After the source electrode layer 405a and the drain electrode layer 405b are formed, the resist masks 448a and 448b are removed.

Ultraviolet light, a KrF laser light, an ArF laser light is preferably used for light exposure for forming the resist masks 448a and 448b. The channel length L of the transistor 440 that is to be completed later is determined by a distance between a bottom edge of the source electrode layer 405a and a bottom edge of the drain electrode layer 405b, which are adjacent to each other over the oxide semiconductor film 403. In the case where the channel length L is less than 25 nm, the light exposure at the time of forming the resist masks 448a and 448b is preferably performed using extreme ultraviolet light having an extremely short wavelength of several nanometers to several tens of nanometers. In the light exposure by extreme ultraviolet light, the resolution is high and the depth of focus is large. Therefore, the channel length (L) of the transistor to be completed later can be greater than or equal to 10 nm and less than or equal to 1000 nm, whereby operation speed of a circuit can be increased.

In order to reduce the number of photomasks used in a photolithography process and reduce the number of steps, an etching step may be performed using a resist mask formed with the use of a multi-tone mask that is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of photomasks can be reduced and the number of corresponding photolithography steps can also be reduced, whereby simplification of the process can be achieved.

In this embodiment, the gas 447 including halogen is used for the etching of the conductive film 445. As the gas 447 including halogen, a gas containing chlorine such as a gas containing chlorine ($Cl_2$), boron trichloride ($BCl_3$), silicon tetrachloride ($SiCl_4$), or carbon tetrachloride ($CCl_4$) can be used. As the gas 447 including halogen, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used. Alternatively, any of the above-mentioned gases to which a rare gas such as helium (He) or argon (Ar) is added, or the like can be used.

As the etching method, a parallel-plate reactive ion etching (RIE) method or an ICP etching method can be used. In order to etch the film into a desired shape, etching conditions (the amount of electric power applied to a coil-shaped electrode, the amount of electric power applied to an electrode on a substrate side, the temperature of the electrode on the substrate side, and the like) are adjusted as appropriate.

The conductive film 445 used in this embodiment is stacked layers of a titanium film with a thickness of 100 nm, an aluminum film with a thickness of 400 nm, and a titanium film with a thickness of 100 nm, which are formed by a sputtering method. The conductive film 445 is etched by etching the stacked layers of the titanium film, the aluminum film, and the titanium film by a dry etching method; thus, the source electrode layer 405a and the drain electrode layer 405b are formed.

In this embodiment, two layers of the titanium film and the aluminum film are etched under a first etching condition, and then the other titanium film is removed singly under a second etching condition. Note that the first etching condition is as follows: an etching gas ($BCl_3$:$Cl_2$=750 sccm: 150 sccm) is used, the bias power is 1500 W, the ICP power supply is 0 W, and the pressure is 2.0 Pa. The second etching condition is as follows: an etching gas ($BCl_3$:$Cl_2$=700 sccm: 100 sccm) is used, the bias power is 750 W, the ICP power supply is 0 W, and the pressure is 2.0 Pa.

In the etching step for forming the source electrode layer 405a and the drain electrode layer 405b, a residue of an etchant (an etching gas or an etching solution) remains on a surface of the oxide semiconductor film and in the vicinity thereof. This residue causes a reduction or variation in electrical characteristics of the transistor such as an increase in leakage current. Further, an element contained in the etchant may enter or attach to the oxide semiconductor film 403 and adversely affect transistor characteristics.

The residue includes the etchant (the etching gas or the etching solution), the processed conductive film 445, the element contained in the oxide semiconductor film 403 which is exposed to the etchant, and a compound of such an element. For example, a gas including halogen is favorably used in the etching step for forming the source and drain electrode layers; in that case, the residue includes a halogen impurity (halogen or a halide).

As the residue, chlorine, fluorine, boron, phosphorus, aluminum, iron, carbon, or the like can be given, for example. In addition, the residue may include the conductive film 445, a metal element (e.g., indium, gallium, or zinc) included in the oxide semiconductor film 403 which is exposed to the etchant, a halide of the metal element, an oxide of the metal element, or the like, in some cases. Further, an element included in the resist masks 448a and 448b may also be included as the residue in some cases.

In this embodiment, because the gas 447 including halogen is used in the etching step for forming the source electrode layer 405a and the drain electrode layer 405b, the remaining residue is a halogen (in this embodiment, chlorine) impurity (halogen or a halide). Further, in the case where boron is also included in the gas 447 including halogen as in this embodiment, the remaining residue includes boron or a compound including boron. Furthermore, in the case where a mixed solution of phosphoric acid, acetic acid, and nitric acid is used as the etchant, the residue includes phosphorus or the like.

After the source electrode layer 405a and the drain electrode layer 405b are formed, a step of removing the residue existing on the surface of the oxide semiconductor film 403 and in the vicinity of the surface between the source electrode layer 405a and the drain electrode layer 405b is performed (see FIG. 1D). Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used. The step of removing the residue has an effect of removing the residue (in this embodiment, mainly halogen or a halide) attached onto the surface of the oxide semiconductor film 403.

It is preferable that etching conditions be optimized so as not to etch and cut the oxide semiconductor film 403 in the step of etching the conductive film 445 and in the residue removal step. However, it is difficult to obtain etching conditions under which only the conductive film 445 is etched and the oxide semiconductor film 445 is not etched at all. In some cases, part of the oxide semiconductor film 403 is etched when the conductive film 445 is etched, so that an oxide semiconductor film having a groove portion (a recessed portion) is formed.

Through the above-described process, the transistor 440 of this embodiment is manufactured.

In this embodiment, the insulating film 407 serving as a protective insulating film is formed in contact with the oxide semiconductor film 403 over the source electrode layer 405a and the drain electrode layer 405b (see FIG. 1E).

The insulating film 407 has a thickness of at least 1 nm and can be formed by a method by which impurities such as water and hydrogen do not enter the insulating film 407, such as a sputtering method, as appropriate. When hydrogen is contained in the insulating film 407, entry of the hydrogen to the oxide semiconductor film 403, or extraction of oxygen from the oxide semiconductor film by hydrogen may occur, in which case the resistance of the back channel in the oxide semiconductor film 403 may be decreased (the back channel may have n-type conductivity), so that a parasitic channel may be formed. Therefore, it is important that a film formation method in which hydrogen is not used is employed in order to form the insulating film 407 containing as little hydrogen as possible.

As the insulating film 407, a single layer or stacked layers of an inorganic insulating film typified by a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, an aluminum nitride oxide film, and the like can be used.

In the case of performing a heating step as the dehydration or dehydrogenation treatment, it is preferable to supply oxygen to the dehydrated or dehydrogenated oxide semiconductor film 403. By supply of oxygen to the oxide semiconductor film 403, an oxygen vacancy in the film can be filled.

In this embodiment, oxygen is supplied to the oxide semiconductor film 403 using the insulating film 407 as a supply source, and thus an example in which an oxide insulating film (e.g., a silicon oxide film or a silicon oxynitride film) including oxygen is used as the insulating film 407 is described. In the case where the insulating film 407 is used as a supply source of oxygen, the insulating film 407 can favorably function as the supply source of oxygen when being a film including much (an excessive amount of) oxygen (preferably, a film including a region that includes an excessive amount of oxygen that exceeds the amount of oxygen in the stoichiometric composition of the oxide semiconductor in a crystalline state).

In this embodiment, as the insulating film 407, a silicon oxide film having a thickness of 300 nm is formed by a sputtering method. The substrate temperature in the film deposition may be higher than or equal to room temperature and lower than or equal to 300° C. and in this embodiment, is 100° C. The silicon oxide film can be formed by a sputtering method under a rare gas (typically, argon) atmosphere, an oxygen atmosphere, or a mixed atmosphere of a rare gas and oxygen. As a target, a silicon oxide target or a silicon target can be used. For example, with use of a silicon target, a silicon oxide film can be formed by a sputtering method under an atmosphere including oxygen.

In order to remove residual moisture from the deposition chamber of the insulating film 407 as in the deposition of the oxide semiconductor film 403, an entrapment vacuum pump (such as a cryopump) is preferably used. When the insulating film 407 is deposited in the deposition chamber evacuated using a cryopump, the impurity concentration of the insulating film 407 can be reduced. As an evacuation unit for removing residual moisture in the deposition chamber of the insulating film 407, a turbo molecular pump provided with a cold trap may be used.

It is preferable to use a high-purity gas from which an impurity such as hydrogen or water is removed as a sputtering gas for the formation of the insulating film 407.

Next, the oxide semiconductor film 403 is subjected to a heating step in a state in which part of the oxide semiconductor film 403 (a channel formation region) is in contact with the insulating film 407.

The heating step is performed at a temperature higher than or equal to 250° C. and lower than or equal to 700° C., preferably higher than or equal to 400° C. and lower than or equal to 700° C., or lower than the strain point of the substrate. For example, the substrate is introduced into an electric furnace which is one kind of heat treatment apparatuses, and the heating step is performed on the oxide semiconductor film at 250° C. for one hour in a nitrogen atmosphere.

For the heating step, a heating method and a heating apparatus similar to those for the heating step for the dehydration or dehydrogenation treatment can be used.

The heating step may be performed under reduced pressure or in a nitrogen atmosphere, an oxygen atmosphere, ultra dry air (air with a moisture amount of less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system), or a rare gas (argon, helium, or the like) atmosphere. It is preferable that water, hydrogen, and the like be not contained in the nitrogen atmosphere, the oxygen atmosphere, the ultra dry air, the rare gas atmosphere, or the like. It is also preferable that the purity of nitrogen, oxygen, or the rare gas which is introduced into the heat treatment apparatus be set to be 6N (99.9999%) or higher, preferably 7N (99.99999%) or higher (that is, the impurity concentration is 1 ppm or lower, preferably 0.1 ppm or lower).

The oxide semiconductor film 403 and the insulating film 407 including oxygen are in contact with each other when the heating step is performed; thus, oxygen which is one of the main components of the oxide semiconductor film 403 and which has been reduced at the same time as the step of removing impurities can be supplied from the insulating film 407 including oxygen to the oxide semiconductor film 403.

Furthermore, a highly dense inorganic insulating film may be provided over the insulating film 407. For example, an aluminum oxide film is formed over the insulating film 407 by a sputtering method. The highly dense aluminum oxide film (with a film density of 3.2 g/cm$^3$ or more, preferably 3.6 g/cm$^3$ or more) enables stable electrical characteristics of the transistor 440. The film density can be measured by Rutherford backscattering spectrometry (RBS) or X-ray reflection (XRR).

An aluminum oxide film which can be used as the protective insulating film provided over the transistor 440 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change, into the oxide semiconductor film 403 and release of oxygen, which is a main constituent material of the oxide semiconductor, from the oxide semiconductor film 403.

In addition, a planarization insulating film may be formed in order to reduce surface unevenness due to the transistor 440. As the planarization insulating film, an organic material such as polyimide, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

For example, an acrylic resin film with a thickness of 1500 nm may be formed as the planarization insulating film. The acrylic resin film can be formed by coating using a coating method and then baking (e.g., at 250° C. under a nitrogen atmosphere for 1 hour).

After the formation of the planarization insulating film, heat treatment may be performed. For example, heat treatment is performed at 250° C. under a nitrogen atmosphere for 1 hour.

In this manner, after the formation of the transistor 440, heat treatment may be performed. The heat treatment may be performed a plurality of times.

Since the surface of the oxide semiconductor film 403 and the vicinity of the surface can be prevented from being contaminated by the residue by performing the above-described step of removing the residue, in the semiconductor device including the transistor 440 that is an inverted staggered bottom-gate transistor, the surface density of the impurities due to the etching step (typically halogen (e.g., chlorine, fluorine), boron, phosphorus, aluminum, iron, or carbon) on the surface of the oxide semiconductor film 403 can be $1\times10^{13}$ atoms/cm$^2$ or lower (preferably $1\times10^{12}$ atoms/cm$^2$ or lower). Further, the concentration of the impurities due to the etching step (typically halogen (e.g., chlorine, fluorine), boron, phosphorus, aluminum, iron, or carbon) on the surface of the oxide semiconductor film 403 can be $5\times10^{18}$ atoms/cm$^3$ or lower (preferably $1\times10^{18}$ atoms/cm$^3$ or lower).

Note that the concentration of the impurities due to the etching step (typically halogen (e.g., chlorine, fluorine), boron, phosphorus, aluminum, iron, or carbon) can be estimated by a method such as SIMS (secondary ion mass spectrometry).

Accordingly, a highly reliable semiconductor device including the transistor 440 using the oxide semiconductor film 403 and having stable electrical characteristics can be provided. In addition, the highly reliable semiconductor device can be manufactured with high yield, so that productivity can be improved.

Embodiment 2

In this embodiment, an embodiment of a semiconductor device and a method for manufacturing the semiconductor device is described with reference to FIGS. 2A to 2E. The same portion as or a portion having a similar function to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 2A:
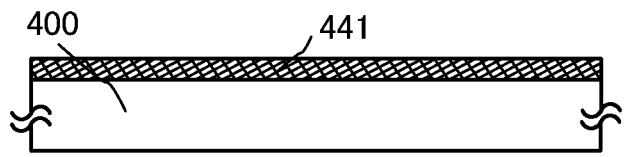
FIGS. 2A to 2E are cross-sectional views illustrating an embodiment of a semiconductor device and a method for manufacturing the semiconductor device.
Figure 2B:
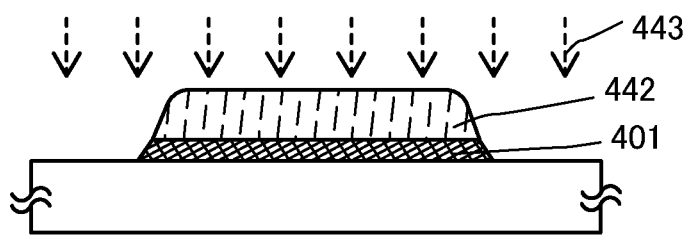
Figure 2C:
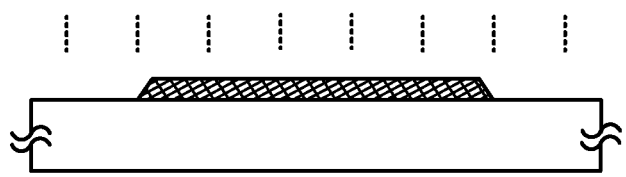
Figure 2D:
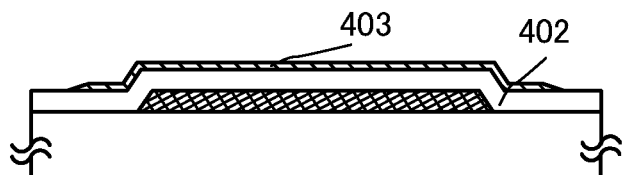
Figure 2E:
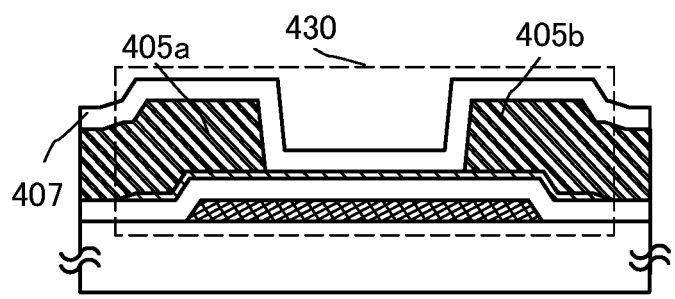

A transistor 430 illustrated in FIG. 2E is an example of an inverted staggered transistor that is one type of a bottom-gate transistor. Note that FIGS. 2A to 2E are cross-sectional views taken along a channel length direction of the transistor 430.

As illustrated in FIG. 2E, a semiconductor device including the transistor 430 includes, over the substrate 400 having an insulating surface, the gate electrode layer 401, the gate insulating film 402, the oxide semiconductor film 403, the source electrode layer 405a, and the drain electrode layer 405b. The insulating film 407 is provided to cover the transistor 430.

An example of a method for manufacturing the semiconductor device including the transistor 430 is illustrated in FIGS. 2A to 2E.

A conductive film 441 is formed over the substrate 400 (see FIG. 2A). The conductive film 441 can be formed using a metal material such as molybdenum, titanium, tantalum, tungsten, aluminum, copper, chromium, neodymium, or scandium or an alloy material which contains any of these metal materials as its main component. Alternatively, a semiconductor film typified by a polycrystalline silicon film doped with an impurity element such as phosphorus, or a silicide film such as a nickel silicide film may be used as the conductive film 441. The conductive film 441 may have a single-layer structure or a stacked-layer structure.

The conductive film 441 can also be formed using a conductive material such as indium oxide including tungsten oxide, indium oxide including titanium oxide, indium tin oxide, indium tin oxide including titanium oxide, indium tin oxide to which silicon oxide is added, indium zinc oxide, or indium zinc oxide including tungsten oxide. It is also possible that the conductive film 441 has a stacked-layer structure of the above conductive material and the above metal material.

In this embodiment, a tungsten film with a thickness of 100 nm is formed by a sputtering method as the conductive film 441.

A resist mask 442 is formed over the conductive film 441 by a photolithography process, and selective etching is performed to form the gate electrode layer 401 (see FIG. 2B). After the gate electrode layer 401 is formed, the resist mask 442 is removed. The etching of the conductive film 441 may be dry etching, wet etching, or both of them.

In this embodiment, the gas 443 including halogen is used for the etching of the conductive film 441. As the gas 443 including halogen, a gas containing chlorine such as a gas containing chlorine ($Cl_2$), boron trichloride ($BCl_3$), silicon tetrachloride ($SiCl_4$), or carbon tetrachloride ($CCl_4$) can be used. As the gas 443 including halogen, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used. Alternatively, any of the above-mentioned gases to which a rare gas such as helium (He) or argon (Ar) is added, or the like can be used.

As the etching method, a parallel-plate RIE method or an ICP etching method can be used. In order to etch the film into a desired shape, etching conditions (the amount of electric power applied to a coil-shaped electrode, the amount of electric power applied to an electrode on a substrate side, the temperature of the electrode on the substrate side, and the like) are adjusted as appropriate.

In this embodiment, dry etching is used in the etching step of the conductive film 441. As the gas 443 including halogen, a gas including carbon tetrafluoride, chlorine, and oxygen ($CF_4$:$Cl_2$:$O_2$=25 sccm: 25 sccm: 10 sccm) is used. The bias power is 1500 W, the ICP power supply is 500 W, and the pressure is 1.0 Pa.

In the etching step for forming the gate electrode layer 401, a residue of an etchant (an etching gas or an etching solution) remains on a surface of the gate electrode layer 401 and in the vicinity thereof. If impurities included in the residue exist on the surface of the gate electrode layer, resistance to voltage (withstand voltage) of the gate insulating film 402 is decreased and leakage current between the gate electrode layer 401 and the source electrode layer 405a or the drain electrode layer 405b is caused. This causes a reduction or variation in electrical characteristics of the transistor.

The residue includes the etchant (the etching gas or the etching solution), the element contained in the processed conductive film 441, and a compound of such an element. For example, a gas including halogen is favorably used in the etching step for forming the gate electrode layer 401; in that case, the residue includes a halogen impurity (halogen or a halide).

As the residue, chlorine, fluorine, boron, phosphorus, aluminum, iron, carbon, or the like can be given, for example. In addition, the residue may include a metal element included in the conductive film 441, a halide of the metal element, an oxide of the metal element, or the like, in some cases. Further, an element included in the resist mask 442 may also be included as the residue in some cases.

In this embodiment, because the gas 443 including halogen is used in the etching step for forming the gate electrode layer 401, the remaining residue is a halogen (in this embodiment, chlorine) impurity (halogen or a halide). Furthermore, in the case where a mixed solution of phosphoric acid, acetic acid, and nitric acid is used as the etchant, the residue includes phosphorus or the like.

After the gate electrode layer 401 is formed, a step of removing the residue existing on the surface of the gate electrode layer 401 and in the vicinity of the surface is performed (see FIG. 2C). Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used.

Next, the gate insulating film 402 is formed over the gate electrode layer 401. In this embodiment, a silicon oxynitride film with a thickness of 200 nm is formed by a high-density plasma CVD method.

The oxide semiconductor film 403 is formed over the gate insulating film 402 (see FIG. 2D). In this embodiment, as the oxide semiconductor film 403, an In—Ga—Zn-based oxide film (an IGZO film) is formed with a thickness of 35 nm by a sputtering method using a sputtering apparatus that includes an AC power supply device. In this embodiment, an In—Ga—Zn-based oxide target with an atomic ratio of In:Ga:Zn=1:1:1 (=1/3:1/3:1/3) is used. The deposition conditions are as follows: the atmosphere is oxygen and argon (the flow rate of oxygen: 50%), the pressure is 0.6 Pa, the power supply is 5 kW, and the substrate temperature is 170° C. The deposition rate under these deposition conditions is 16 nm/min.

Heat treatment may be conducted on the oxide semiconductor film 403 in order to remove excess hydrogen (including water and a hydroxyl group) (to perform dehydration or dehydrogenation). In this embodiment, the substrate is introduced into an electric furnace which is one kind of heat treatment apparatuses, and the oxide semiconductor film 403 is subjected to heat treatment at 450° C. in a nitrogen atmosphere for 1 hour and then heat treatment at 450° C. in an atmosphere including nitrogen and oxygen for 1 hour.

Next, a conductive film is formed over the gate electrode layer 401, the gate insulating film 402, and the oxide semiconductor film 403 and is etched, so that the source electrode layer 405a and the drain electrode layer 405b are formed. Note that the etching of the conductive film may be performed by dry etching, wet etching, or both of them.

In this embodiment, a titanium film with a thickness of 100 nm, an aluminum film with a thickness of 400 nm, and a titanium film with a thickness of 100 nm are stacked by a sputtering method, and the stacked layers of the titanium film, the aluminum film, and the titanium film are etched by a dry etching method, so that the source electrode layer 405a and the drain electrode layer 405b are formed.

Through the above-described process, the transistor 430 of this embodiment is manufactured.

In this embodiment, the insulating film 407 serving as a protective insulating film is formed in contact with the oxide semiconductor film 403 over the source electrode layer 405a and the drain electrode layer 405b (see FIG. 2E). For example, a silicon oxynitride film with a thickness of 400 nm is formed by a CVD method. After the formation of the protective insulating film, heat treatment may be performed. For example, heat treatment is performed at 300° C. in a nitrogen atmosphere for 1 hour.

In addition, a planarization insulating film may be formed in order to reduce surface unevenness due to the transistor 430.

For example, an acrylic resin film with a thickness of 1500 nm may be formed as the planarization insulating film over the protective insulating film. The acrylic resin film can be formed by coating using a coating method and then baking (e.g., at 250° C. under a nitrogen atmosphere for 1 hour).

After the formation of the planarization insulating film, heat treatment may be performed. For example, heat treatment is performed at 250° C. under a nitrogen atmosphere for 1 hour.

Since the surface of the gate electrode layer 401 and the vicinity of the surface can be prevented from being contaminated by the residue, in the semiconductor device including the transistor 420 that is an inverted staggered bottom-gate transistor, the surface density of the impurities due to the etching step (typically halogen (e.g., chlorine, fluorine), boron, phosphorus, aluminum, iron, or carbon) on the surface of the gate electrode layer 401 is $1 \times 10^{13}$ atoms/cm$^2$ or lower (preferably $1 \times 10^{12}$ atoms/cm$^2$ or lower). Further, the concentration of the impurities due to the etching step (typically halogen (e.g., chlorine, fluorine), boron, phosphorus, aluminum, iron, or carbon) on the surface of the gate electrode layer 401 can be $5 \times 10^{18}$ atoms/cm$^3$ or lower (preferably $1 \times 10^{18}$ atoms/cm$^3$ or lower).

Accordingly, a highly reliable semiconductor device including the transistor 430 using the oxide semiconductor film 403 and having stable electrical characteristics can be provided. In addition, the highly reliable semiconductor device can be manufactured with high yield, so that productivity can be improved.

Embodiment 3

In this embodiment, an embodiment of a semiconductor device and a method for manufacturing the semiconductor device is described with reference to FIGS. 3A to 3F. The same portion as or a portion having a similar function to those in the above embodiments can be formed in a manner similar to that described in the above embodiments, and also the steps similar to those in the above embodiments can be performed in a manner similar to that described in the above embodiments, and repetitive description is omitted. In addition, detailed description of the same portions is not repeated.

Figure 3A:
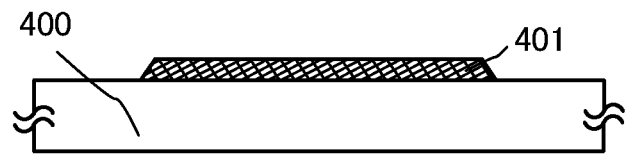
FIGS. 3A to 3F are cross-sectional views illustrating an embodiment of a semiconductor device and a method for manufacturing the semiconductor device.
Figure 3B:
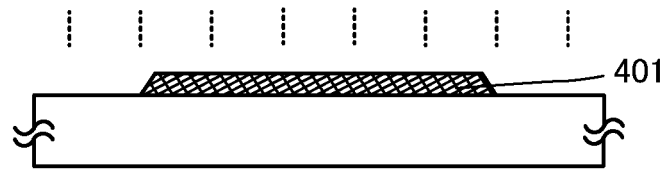
Figure 3C:
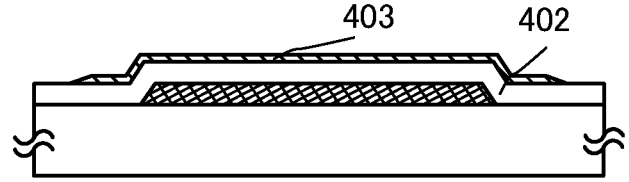
Figure 3D:
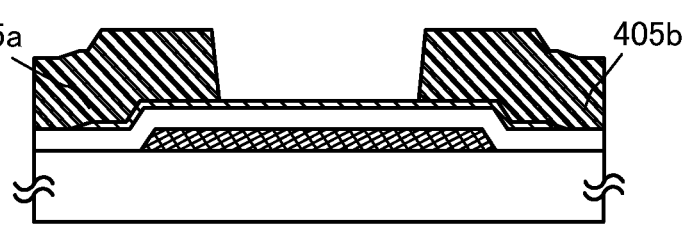
Figure 3E:
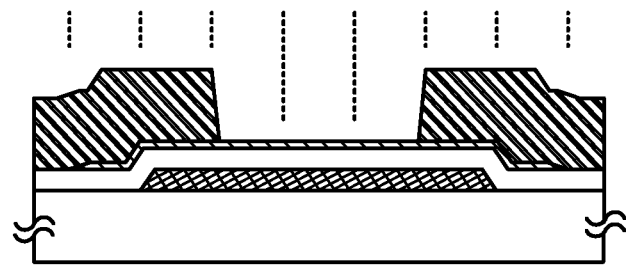
Figure 3F:
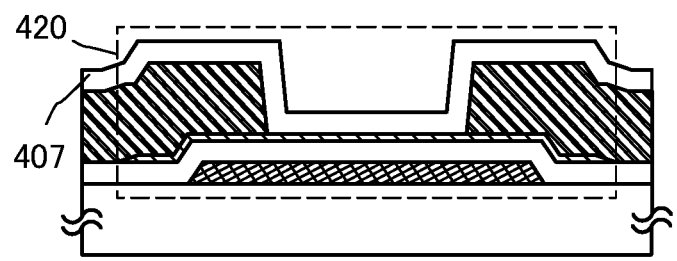

A transistor 420 illustrated in FIG. 3F is an example of an inverted staggered transistor that is one type of a bottom-gate transistor. Note that FIGS. 3A to 3F are cross-sectional views taken along a channel length direction of the transistor 420.

As illustrated in FIG. 3F, a semiconductor device including the transistor 420 includes, over the substrate 400 having an insulating surface, the gate electrode layer 401, the gate insulating film 402, the oxide semiconductor film 403, the source electrode layer 405a, and the drain electrode layer 405b. The insulating film 407 is provided to cover the transistor 420.

An example of a method for manufacturing the semiconductor device including the transistor 420 is illustrated in FIGS. 3A to 3F.

A conductive film is formed over the substrate 400 having an insulating surface. The conductive film can be formed using a metal material such as molybdenum, titanium, tantalum, tungsten, aluminum, copper, chromium, neodymium, or scandium or an alloy material which contains any of these metal materials as its main component. Alternatively, a semiconductor film typified by a polycrystalline silicon film doped with an impurity element such as phosphorus, or a silicide film such as a nickel silicide film may be used as the conductive film. The conductive film may have a single-layer structure or a stacked-layer structure.

The conductive film can also be formed using a conductive material such as indium oxide including tungsten oxide, indium oxide including titanium oxide, indium tin oxide, indium tin oxide including titanium oxide, indium tin oxide to which silicon oxide is added, indium zinc oxide, or indium zinc oxide including tungsten oxide. It is also possible that the conductive film has a stacked-layer structure of the above conductive material and the above metal material.

In this embodiment, a tungsten film with a thickness of 100 nm is formed by a sputtering method as the conductive film.

A resist mask is formed over the conductive film by a photolithography process, and selective etching is performed to form the gate electrode layer 401 (see FIG. 3A). After the gate electrode layer 401 is formed, the resist mask is removed. The etching of the conductive film may be dry etching, wet etching, or both of them.

In this embodiment, the gas including halogen is used for the etching of the conductive film. As the gas including halogen, a gas containing chlorine such as a gas containing chlorine ($Cl_2$), boron trichloride ($BCl_3$), silicon tetrachloride ($SiCl_4$), or carbon tetrachloride ($CCl_4$) can be used. As the gas including halogen, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used. Alternatively, any of the above-mentioned gases to which a rare gas such as helium (He) or argon (Ar) is added, or the like can be used.

As the etching method, a parallel-plate RIE method or an ICP etching method can be used. In order to etch the film into a desired shape, etching conditions (the amount of electric power applied to a coil-shaped electrode, the amount of electric power applied to an electrode on a substrate side, the temperature of the electrode on the substrate side, and the like) are adjusted as appropriate.

In this embodiment, dry etching is used in the etching step of the conductive film. Etching conditions are as follows: as the gas including halogen, a gas including carbon tetrafluoride, chlorine, and oxygen ($CF_4:Cl_2:O_2$=25 sccm: 25 sccm: 10 sccm) is used; the bias power is 1500 W; the ICP power supply is 500 W; and the pressure is 1.0 Pa.

In the etching step for forming the gate electrode layer 401, a residue of an etchant (an etching gas or an etching solution) remains on a surface of the gate electrode layer 401 and in the vicinity thereof. If impurities included in the residue exist on the surface of the gate electrode layer, withstand voltage of the gate insulating film 402 is decreased and leakage current between the gate electrode layer 401 and the source electrode layer 405a or the drain electrode layer 405b is caused. This causes a reduction or variation in electrical characteristics of the transistor.

The residue includes the etchant (the etching gas or the etching solution), the element contained in the processed conductive film, and a compound of such an element. For example, a gas including halogen is favorably used in the etching step for forming the gate electrode layer 401; in that case, the residue includes a halogen impurity (halogen or a halide).

As the residue, chlorine, fluorine, boron, phosphorus, aluminum, iron, carbon, or the like can be given, for example. In addition, the residue may include a metal element included in the conductive film, a halide of the metal element, an oxide of the metal element, or the like, in some cases. Further, an element included in the resist mask may also be included as the residue in some cases.

In this embodiment, because the gas including halogen is used in the etching step for forming the gate electrode layer 401, the remaining residue is a halogen (in this embodiment, chlorine) impurity (halogen or a halide). Furthermore, in the case where a mixed solution of phosphoric acid, acetic acid, and nitric acid is used as the etchant, the residue includes phosphorus or the like.

After the gate electrode layer 401 is formed, a step of removing the residue existing on the surface of the gate electrode layer 401 and in the vicinity of the surface is performed (see FIG. 3B). Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used.

Next, the gate insulating film 402 is formed over the gate electrode layer 401. In this embodiment, a silicon oxynitride film with a thickness of 200 nm is formed by a high-density plasma CVD method.

The oxide semiconductor film 403 is formed over the gate insulating film 402 (see FIG. 3C). In this embodiment, as the oxide semiconductor film 403, an In—Ga—Zn-based oxide film (an IGZO film) is formed with a thickness of 35 nm by a sputtering method using a sputtering apparatus that includes an AC power supply device. In this embodiment, an In—Ga—Zn-based oxide target with an atomic ratio of In:Ga:Zn=1:1:1 (=1/3:1/3:1/3) is used. The deposition conditions are as follows: the atmosphere is oxygen and argon (the flow rate of oxygen: 50%), the pressure is 0.6 Pa, the power supply is 5 kW, and the substrate temperature is 170° C. The deposition rate under these deposition conditions is 16 nm/min.

Heat treatment may be conducted on the oxide semiconductor film 403 in order to remove excess hydrogen (including water and a hydroxyl group) (to perform dehydration or dehydrogenation). In this embodiment, the substrate is introduced into an electric furnace which is one kind of heat treatment apparatuses, and the oxide semiconductor film 403 is subjected to heat treatment at 450° C. in a nitrogen atmosphere for 1 hour and then heat treatment at 450° C. in an atmosphere including nitrogen and oxygen for 1 hour.

Next, a conductive film to be processed into a source electrode layer and a drain electrode layer is formed over the gate electrode layer 401, the gate insulating film 402, and the oxide semiconductor film 403.

The conductive film is formed of a material that can withstand heat treatment performed later. As the conductive film used for forming the source electrode layer and the drain electrode layer, it is possible to use, for example, a metal film containing an element selected from Al, Cr, Cu, Ta, Ti, Mo, and W, a metal nitride film containing any of the above-mentioned elements as its component (a titanium nitride film, a molybdenum nitride film, or a tungsten nitride film), or the like. Alternatively, it is possible to use a structure in which a film of a high-melting-point metal such as Ti, Mo, or W or a metal nitride film thereof (e.g., a titanium nitride film, a molybdenum nitride film, or a tungsten nitride film) is stacked over and/or below a metal film such as an Al film or a Cu film. Further alternatively, a conductive metal oxide may be used as a material of the conductive film used for forming the source electrode layer and the drain electrode layer. As the conductive metal oxide, indium oxide ($In_2O_3$), tin oxide ($SnO_2$), zinc oxide (ZnO), indium tin oxide ($In_2O_3$—$SnO_2$; abbreviated to ITO), indium zinc oxide ($In_2O_3$—ZnO), or any of these metal oxide materials containing silicon oxide can be used.

A resist mask is formed over the conductive film by a photolithography process. Selective etching is performed, so that the source electrode layer 405a and the drain electrode layer 405b are formed (see FIG. 3D). After the source electrode layer 405a and the drain electrode layer 405b are formed, the resist mask is removed.

In this embodiment, the gas including halogen is used for the etching of the conductive film. As the gas including halogen, a gas containing chlorine such as a gas containing chlorine ($Cl_2$), boron trichloride ($BCl_3$), silicon tetrachloride ($SiCl_4$), or carbon tetrachloride ($CCl_4$) can be used. As the gas including halogen, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used. Alternatively, any of the above-mentioned gases to which a rare gas such as helium (He) or argon (Ar) is added, or the like can be used.

As the etching method, a parallel-plate RIE method or an ICP etching method can be used. In order to etch the film into a desired shape, etching conditions (the amount of electric power applied to a coil-shaped electrode, the amount of electric power applied to an electrode on a substrate side, the temperature of the electrode on the substrate side, and the like) are adjusted as appropriate.

The conductive film used in this embodiment is stacked layers of a titanium film with a thickness of 100 nm, an aluminum film with a thickness of 400 nm, and a titanium film with a thickness of 100 nm, which are formed by a sputtering method. The conductive film is etched by etching the stacked layers of the titanium film, the aluminum film, and the titanium film by a dry etching method; thus, the source electrode layer 405a and the drain electrode layer 405b are formed.

In this embodiment, two layers of the titanium film and the aluminum film are etched under a first etching condition, and then the other titanium film is removed singly under a second etching condition. Note that the first etching condition is as follows: an etching gas ($BCl_3$:$Cl_2$=750 sccm: 150 sccm) is used, the bias power is 1500 W, the ICP power supply is 0 W, and the pressure is 2.0 Pa. The second etching condition is as follows: an etching gas ($BCl_3$:$Cl_2$=700 sccm: 100 sccm) is used, the bias power is 750 W, the ICP power supply is 0 W, and the pressure is 2.0 Pa.

In the etching step for forming the source electrode layer 405a and the drain electrode layer 405b, a residue of an etchant (an etching gas or an etching solution) remains on a surface of the oxide semiconductor film and in the vicinity thereof. This residue causes a reduction or variation in electrical characteristics of the transistor such as an increase in leakage current. Further, an element contained in the etchant may enter or attach to the oxide semiconductor film 403 and adversely affect transistor characteristics.

The residue includes the etchant (the etching gas or the etching solution), the processed conductive film, the element contained in the oxide semiconductor film 403 which is exposed to the etchant, and a compound of such an element. For example, a gas including halogen is favorably used in the etching step for forming the source and drain electrode layers; in that case, the residue includes a halogen impurity (halogen or a halide).

As the residue, chlorine, fluorine, boron, phosphorus, aluminum, iron, carbon, or the like can be given, for example. In addition, the residue may include the conductive film, a metal element (e.g., indium, gallium, or zinc) included in the oxide semiconductor film 403 which is exposed to the etchant, a halide of the metal element, an oxide of the metal element, or the like, in some cases. Further, an element included in the resist mask may also be included as the residue in some cases.

In this embodiment, because the gas including halogen is used in the etching step for forming the source electrode layer 405a and the drain electrode layer 405b, the remaining residue is a halogen (in this embodiment, chlorine) impurity (halogen or a halide). Further, in the case where boron is also included in the gas including halogen as in this embodiment, the remaining residue includes boron or a compound including boron. Furthermore, in the case where a mixed solution of phosphoric acid, acetic acid, and nitric acid is used as the etchant, the residue includes phosphorus or the like.

After the source electrode layer 405a and the drain electrode layer 405b are formed, a step of removing the residue existing on the surface of the oxide semiconductor film 403 and in the vicinity of the surface between the source electrode layer 405a and the drain electrode layer 405b is performed (see FIG. 3E). Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used. The step of removing the residue has an effect of removing the residue (in this embodiment, mainly halogen or a halide) attached onto the surface of the oxide semiconductor film 403.

Through the above-described process, the transistor 420 of this embodiment is manufactured.

In this embodiment, the insulating film 407 serving as a protective insulating film is formed in contact with the oxide semiconductor film 403 over the source electrode layer 405a and the drain electrode layer 405b (see FIG. 3F). For example, a silicon oxynitride film with a thickness of 400 nm is formed by a CVD method. After the formation of the protective insulating film, heat treatment may be performed. For example, heat treatment is performed at 300° C. in a nitrogen atmosphere for 1 hour.

In addition, a planarization insulating film may be formed in order to reduce surface unevenness due to the transistor 430.

For example, an acrylic resin film with a thickness of 1500 nm may be formed as the planarization insulating film over the protective insulating film. The acrylic resin film can be formed by coating using a coating method and then baking (e.g., at 250° C. under a nitrogen atmosphere for 1 hour).

After the formation of the planarization insulating film, heat treatment may be performed. For example, heat treatment is performed at 250° C. under a nitrogen atmosphere for 1 hour.

Since the surfaces of the gate electrode layer 401 and the oxide semiconductor film 403 and the vicinity of the surfaces can be prevented from being contaminated by the residue by the above-described method, in the semiconductor device including the transistor 420 that is an inverted staggered bottom-gate transistor, the surface density of the impurities due to the etching step (typically halogen (e.g., chlorine, fluorine), boron, phosphorus, aluminum, iron, or carbon) on the surface of the oxide semiconductor film 403 can be $1\times10^{13}$ atoms/cm$^2$ or lower (preferably $1\times10^{12}$ atoms/cm$^2$ or lower). Further, the surface density of the impurities due to the etching step (typically halogen (e.g., chlorine, fluorine), boron, phosphorus, aluminum, iron, or carbon) on the surface of the gate electrode layer 401 can be $1\times10^{13}$ atoms/cm$^2$ or lower (preferably $1\times10^{12}$ atoms/cm$^2$ or lower).

The concentration of the impurities due to the etching step (typically halogen (e.g., chlorine, fluorine), boron, phosphorus, aluminum, iron, or carbon) on the surface of the oxide semiconductor film 403 can be $5\times10^{18}$ atoms/cm$^3$ or lower (preferably $1\times10^{18}$ atoms/cm$^3$ or lower). Further, the concentration of the impurities due to the etching step (typically halogen (e.g., chlorine, fluorine), boron, phosphorus, aluminum, iron, or carbon) on the surface of the gate electrode layer 401 can be $5\times10^{18}$ atoms/cm$^3$ or lower (preferably $1\times10^{18}$ atoms/cm$^3$ or lower).

Accordingly, a highly reliable semiconductor device including the transistor 420 using the oxide semiconductor film 403 and having stable electrical characteristics can be provided. In addition, the highly reliable semiconductor device can be manufactured with high yield, so that productivity can be improved.

Embodiment 4

A semiconductor device having a display function (also referred to as a display device) can be manufactured using any of the transistors described in Embodiments 1 to 3. Further, part or all of the driver circuitry which includes the transistor can be formed over a substrate where a pixel portion is formed, whereby a system-on-panel can be formed.

Figure 4A:
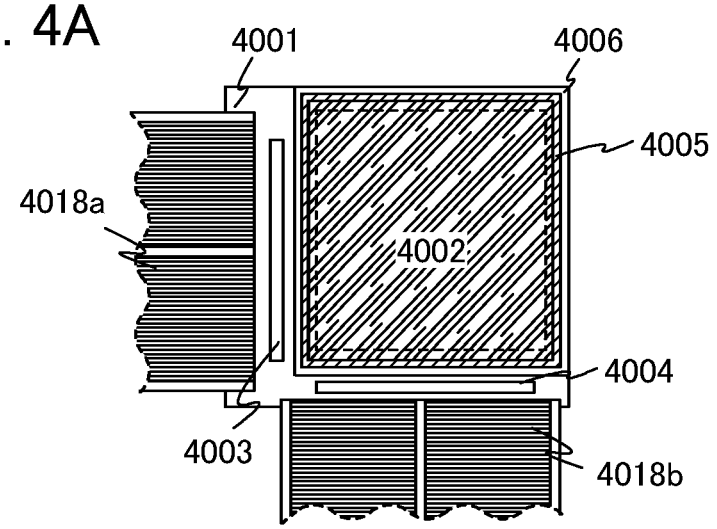
FIGS. 4A to 4C are plan views illustrating examples of a semiconductor device.

In FIG. 4A, a sealant 4005 is provided so as to surround a pixel portion 4002 provided over a first substrate 4001, and the pixel portion 4002 is sealed with a second substrate 4006. In FIG. 4A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003 and the scan line driver circuit 4004 each of which is separately formed, and the pixel portion 4002 from flexible printed circuits (FPCs) 4018a and 4018b.

Figure 4B:
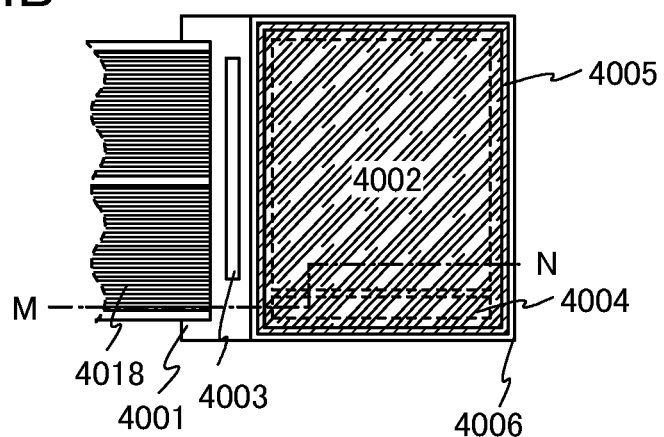
Figure 4C:
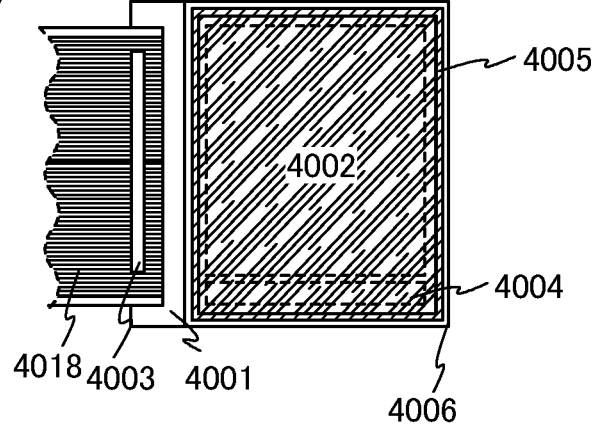

In FIGS. 4B and 4C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 4B and 4C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 4B and 4C, a variety of signals and potentials are supplied to the signal line driver circuit 4003 which is separately formed, the scan line driver circuit 4004, and the pixel portion 4002 from the FPC 4018.

Although FIGS. 4B and 4C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on a connection method of a separately formed driver circuit, and a chip on glass (COG) method, a wire bonding method, a tape automated bonding (TAB) method, or the like can be used. FIG. 4A illustrates an example in which the signal line driver circuit 4003 and the scan line driver circuit 4004 are mounted by a COG method. FIG. 4B illustrates an example in which the signal line driver circuit 4003 is mounted by a COG method. FIG. 4C illustrates an example in which the signal line driver circuit 4003 is mounted by a TAB method.

The display device includes, in its category, a panel in which a display element is sealed, and a module in which an IC or the like including a controller is mounted on the panel.

Note that a display device in this specification means an image display device, a display device, or a light source (including a lighting device).

Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in any of Embodiments 1 to 3 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

Embodiments of the semiconductor device will be described with reference to FIGS. 4A to 4C, FIGS. 5A and 5B, and FIGS. 6A and 6B. FIGS. 6A and 6B correspond to the cross-sectional view taken along line M-N in FIG. 4B.

As illustrated in FIGS. 4A to 4C and FIGS. 6A and 6B, the semiconductor device includes a connection terminal electrode 4015 and a terminal electrode 4016. The connection terminal electrode 4015 and the terminal electrode 4016 are electrically connected to a terminal included in the FPC 4018 (FPCs 4018a and 4018b) through an anisotropic conductive film 4019.

The connection terminal electrode 4015 is formed using the same conductive film as a first electrode layer 4030, and the terminal electrode 4016 is formed using the same conductive film as gate electrode layers of the transistors 4010 and 4011.

The pixel portion 4002 and the scan line driver circuit 4004 which are provided over the first substrate 4001 include a plurality of transistors. FIGS. 6A and 6B illustrate the transistor 4010 included in the pixel portion 4002 and the transistor 4011 included in the scan line driver circuit 4004. In FIG. 6A, an insulating film 4020 is provided over the transistors 4010 and 4011, and in FIG. 6B, an insulating film 4021 is further provided.

The transistor described in any of Embodiments 1 to 3 can be applied to the transistor 4010 and the transistor 4011. In this embodiment, an example in which a transistor whose structure and manufacturing method are similar to those of the transistor 440 described in Embodiment 1 is used will be described.

In manufacturing the transistors 4010 and 4011 whose structure and manufacturing method are similar to those of the transistor 440 described in Embodiment 1, after the source electrode layer and the drain electrode layer are formed, a step of removing the residue existing on the surface of the oxide semiconductor film and in the vicinity of the surface between the source electrode layer and the drain electrode layer is performed. Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used.

As described in Embodiment 2, after the formation of the gate electrode layer, the step of removing the residue caused on the surface of the gate electrode layer and in the vicinity of the surface due to the etching step may be performed. Further, as described in Embodiment 3, the step of removing the residue on the surface of the gate electrode layer and in the vicinity of the surface may be performed after the formation of the gate electrode layer, and then the step of removing the residue on the surface of the oxide semiconductor film and in the vicinity of the surface may be performed after the formation of the source and drain electrode layers.

Since the surface of the oxide semiconductor film and the vicinity of the surface can be prevented from being contaminated by the residue, in the transistors 4010 and 4011, the surface density of the impurities due to the etching step (typically halogen (e.g., chlorine, fluorine), boron, phosphorus, aluminum, iron, or carbon) on the surface of the oxide semiconductor film can be $1 \times 10^{13}$ atoms/cm$^2$ or lower (preferably $1 \times 10^{12}$ atoms/cm$^2$ or lower). Further, the concentration of the impurities due to the etching step (typically halogen (e.g., chlorine, fluorine), boron, phosphorus, aluminum, iron, or carbon) on the surface of the oxide semiconductor film can be $5 \times 10^{18}$ atoms/cm$^3$ or lower (preferably $1 \times 10^{18}$ atoms/cm$^3$ or lower).

Thus, the semiconductor devices including the transistors 4010 and 4011 using an oxide semiconductor film and having stable electrical characteristics, illustrated in FIGS. 4A to 4C and FIGS. 6A and 6B according to this embodiment, can have high reliability. Further, such a highly reliable semiconductor device can be manufactured with a high yield, so that high productivity can be achieved.

A conductive layer may be further provided so as to overlap with the channel formation region of the oxide semiconductor film of the transistor 4011 for the driver circuit. By providing the conductive layer so as to overlap with the channel formation region of the oxide semiconductor film, the amount of change in the threshold voltage of the transistor 4011 from before to after a bias-temperature stress test (BT test) can be further reduced. The conductive layer may have the same potential as or a potential different from that of the gate electrode layer of the transistor 4011, and can function as a second gate electrode layer. The potential of the conductive layer may be GND or 0 V, or the conductive layer may be in a floating state.

In addition, the conductive layer has a function of blocking an external electric field, that is, a function of preventing an external electric field (particularly, a function of preventing static electricity) from affecting the inside (a circuit portion including a transistor). The blocking function of the conductive layer can prevent fluctuation in electrical characteristics of the transistor due to the influence of an external electric field such as static electricity.

The transistor 4010 included in the pixel portion 4002 is electrically connected to a display element to form a display panel. There is no particular limitation on the kind of display element as long as display can be performed, and a variety of kinds of display elements can be employed.

An example of a liquid crystal display device using a liquid crystal element as a display element is illustrated in FIG. 6A. In FIG. 6A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which makes the alignment process unnecessary and the viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor including an oxide semiconductor film has a possibility that the electrical characteristics of the transistor may fluctuate significantly by the influence of static electricity and deviate from the designed range. Thus, it is more effective to use a liquid crystal composition exhibiting a blue phase for the liquid crystal display device including the transistor including an oxide semiconductor film.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using the transistor including an oxide semiconductor film, which is disclosed in this specification, it is enough to provide a storage capacitor having a capacitance that is ⅓ or less, preferably ⅕ or less of liquid crystal capacitance of each pixel.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Thus, the frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples can be given as the vertical alignment mode, and for example a multi-domain vertical alignment (MVA) mode, a patterned vertical alignment (PVA) mode, or an advanced super view (ASV) mode can be used. This embodiment can also be applied to a VA liquid crystal display device. The VA mode is a kind of mode in which alignment of liquid crystal molecules of a liquid crystal display panel is controlled. In the VA liquid crystal display device, liquid crystal molecules are aligned in a vertical direction with respect to a panel surface when no voltage is applied to the display device. It is also possible to use a method called domain multiplication or multi-domain design, in which a pixel is divided into some regions (subpixels) and molecules are aligned in different directions in the respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors of R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Note that one embodiment of the invention disclosed herein is not limited to the application to a display device for color display and can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example of using an organic EL element as a light-emitting element is described.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

To extract light emitted from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

Figure 5A:
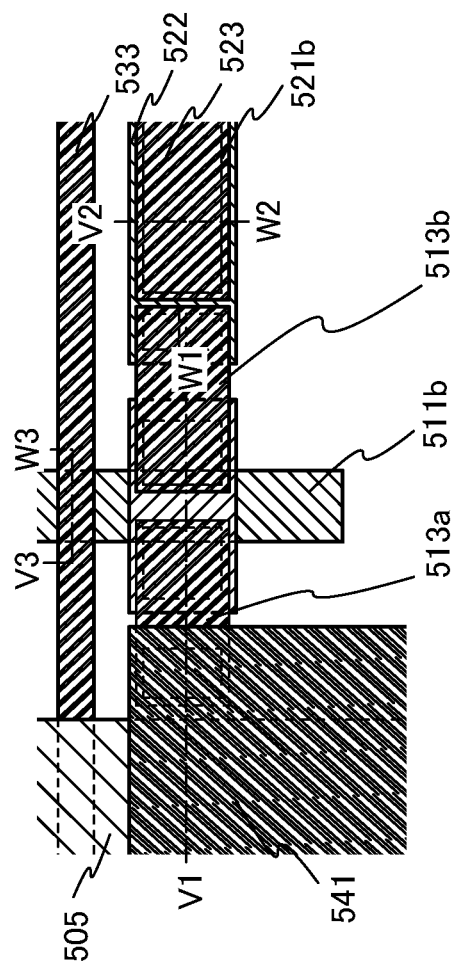
FIGS. 5A and 5B are a plan view and a cross-sectional view, respectively, illustrating an example of a semiconductor device.
Figure 5B:
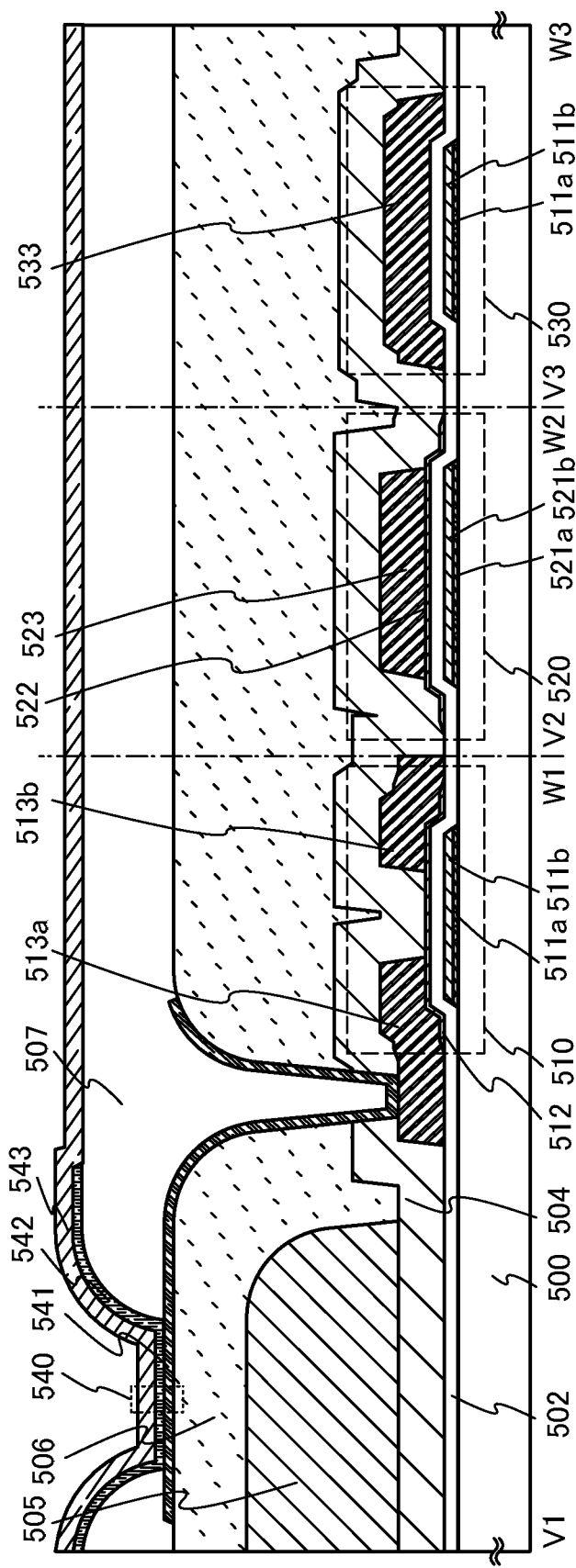
Figure 6A:
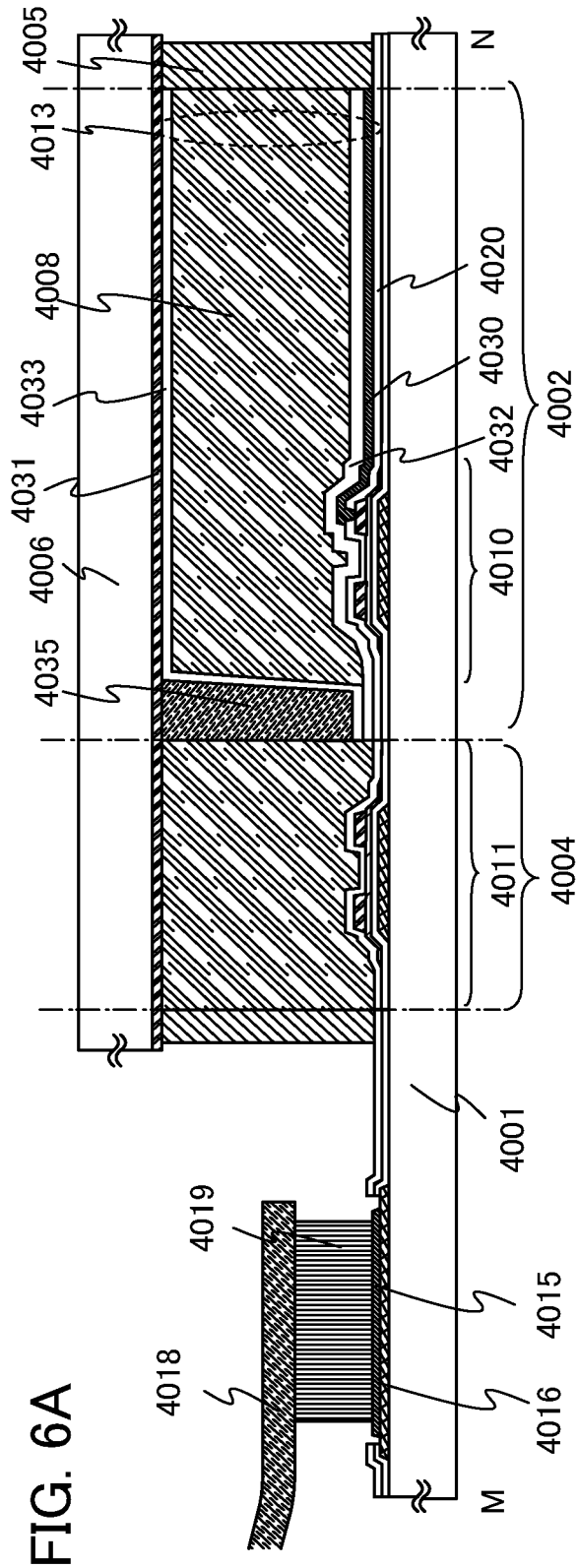
FIGS. 6A and 6B are cross-sectional views illustrating examples of a semiconductor device.
Figure 6B:
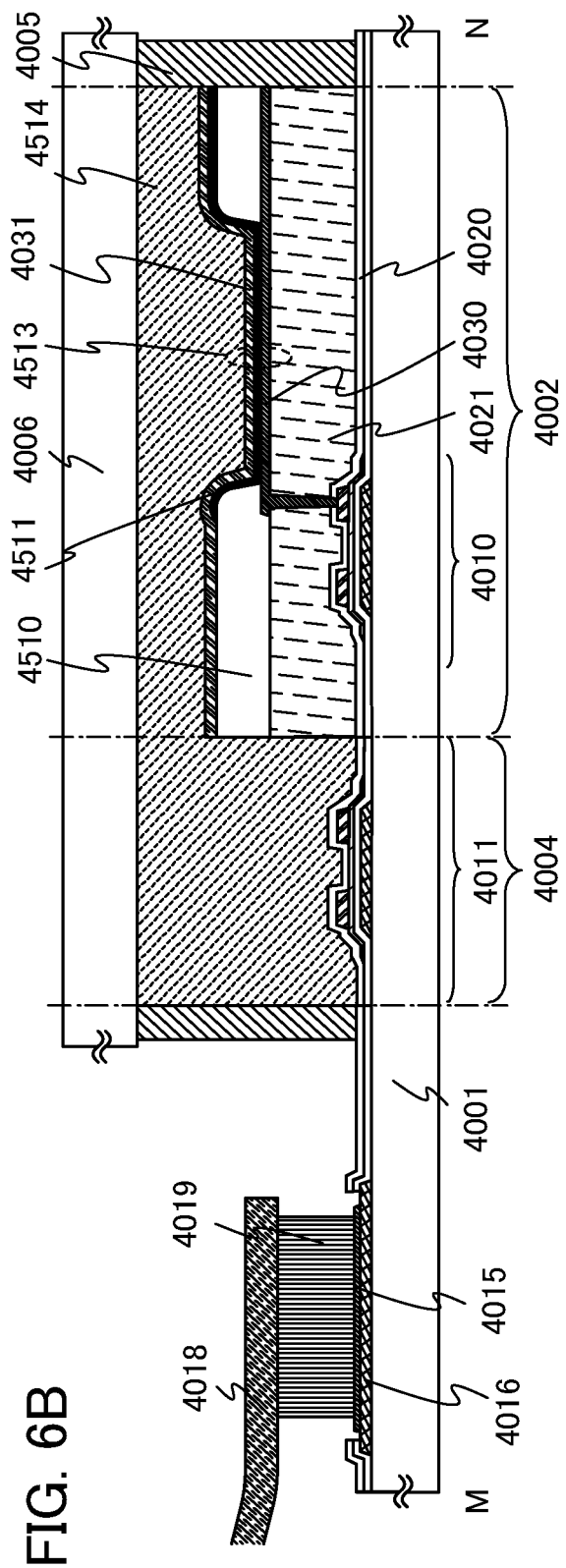

FIGS. 5A and 5B and FIG. 6B illustrate examples of a light-emitting device including a light-emitting element as a display element.

FIG. 5A is a plan view of a light-emitting device and FIG. 5B is a cross-sectional view taken along dashed-dotted lines V1-W1, V2-W2, and V3-W3 in FIG. 5A. Note that, an electroluminescent layer 542 and a second electrode layer 543 are not illustrated in the plan view in FIG. 5A.

The light-emitting device illustrated in FIGS. 5A and 5B includes, over a substrate 500, a transistor 510, a capacitor 520, and an intersection 530 of wiring layers. The transistor 510 is electrically connected to a light-emitting element 540. Note that FIGS. 5A and 5B illustrate a bottom-emission light-emitting device in which light from the light-emitting element 540 is extracted through the substrate 500.

The transistor described in any of Embodiments 1 to 3 can be applied to the transistor 510. In this embodiment, an example in which a transistor whose structure and manufacturing method are similar to those of the transistor 440 described in Embodiment 1 is used will be described.

The transistor 510 includes gate electrode layers 511a and 511b, a gate insulating film 502, an oxide semiconductor film 512, and conductive layers 513a and 513b functioning as a source electrode layer and a drain electrode layer.

In manufacturing the transistor 510 whose structure and manufacturing method are similar to those of the transistor 440 described in Embodiment 1, after the conductive layers 513a and 513b functioning as the source electrode layer and the drain electrode layer are formed, a step of removing the residue existing on the surface of the oxide semiconductor film 512 and in the vicinity of the surface between the conductive layer 513a and the conductive layer 513b functioning as the source electrode layer and the drain electrode layer is performed. Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used.

As described in Embodiment 2, after the formation of the gate electrode layers 511a and 511b, the step of removing the residue caused on the surfaces of the gate electrode layers 511a and 511b and in the vicinity of the surfaces due to the etching step may be performed. Further, as described in Embodiment 3, the step of removing the residue on the surfaces of the gate electrode layers 511a and 511b and in the vicinity of the surfaces may be performed after the formation of the gate electrode layers 511a and 511b, and then the step of removing the residue on the surface of the oxide semiconductor film 512 and in the vicinity of the surface may be performed after the formation of the conductive layers 513a and 513b.

Since the surface of the oxide semiconductor film 512 and the vicinity of the surface can be prevented from being contaminated by the residue, in the transistor 510, the surface density of the impurities due to the etching step (typically halogen (e.g., chlorine, fluorine), boron, phosphorus, aluminum, iron, or carbon) on the surface of the oxide semiconductor film 512 can be $1\times10^{13}$ atoms/cm$^2$ or lower (preferably $1\times10^{12}$ atoms/cm$^2$ or lower). Further, the concentration of the impurities due to the etching step (typically halogen (e.g., chlorine, fluorine), boron, phosphorus, aluminum, iron, or carbon) on the surface of the oxide semiconductor film 512 can be $5\times10^{18}$ atoms/cm$^3$ or lower (preferably $1\times10^{18}$ atoms/cm$^3$ or lower).

Thus, the semiconductor device including the transistor 510 using the oxide semiconductor film 512 and having stable electrical characteristics, illustrated in FIGS. 5A and 5B according to this embodiment, can have high reliability. Further, such a highly reliable semiconductor device can be manufactured with a high yield, so that high productivity can be achieved.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 provided therebetween.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer has a stacked-layer structure of a titanium film and a copper thin film.

A 25-nm-thick IGZO film is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma CVD method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 6B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 be formed using a photosensitive resin material to have openings over the first electrode layers 4030 and 541, respectively. A sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is sealed with the first substrate 4001, the second substrate 4006, and the sealant 4005, a filler 4514 is provided. In this manner, it is preferable that a panel be packaged (sealed) with a protective film (such as a laminate film or an ultraviolet curable resin film) or a cover material with high air-tightness and little degasification so that the panel is not exposed to the outside air.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the first particles and the second particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 4A to 4C, FIGS. 5A and 5B, and FIGS. 6A and 6B, a flexible substrate as well as a glass substrate can be used as any of the first substrates 4001 and 500 and the second substrate 4006. For example, a plastic substrate having a light-transmitting property or the like can be used. As the plastic substrate, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

The insulating films 4021 and 506 serving as planarization insulating films can be formed using an organic material having heat resistance, such as an acrylic-, polyimide-, or benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the insulating film may be formed by stacking a plurality of insulating films formed using any of these materials.

There is no particular limitation on the methods of forming the insulating films 4021 and 506, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Thus, the substrate and the thin films such as the insulating film and the conductive film provided for the pixel portion where light is transmitted all have light-transmitting properties with respect to light in the visible light wavelength range.

The first electrode layer and the second electrode layer (which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene.

The first electrode layers 4030 and 541 and the second electrode layers 4031 and 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof and nitrides thereof.

In this embodiment, since the light-emitting device illustrated in FIGS. 5A and 5B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; and in the case of using a light-transmissive conductive film as the second electrode layer 543, a conductive film having a light-reflecting property is preferably stacked therewith.

A conductive composition containing a conductive high molecule (also referred to as a conductive polymer) can be used for the first electrode layers 4030 and 541 and the second electrode layers 4031 and 543. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protection circuit for protecting the driver circuit is preferably provided. The protection circuit is preferably formed using a nonlinear element.

As described above, by using the transistor described in any of Embodiments 1 to 3, a semiconductor device having a variety of functions can be provided.

The structures, methods, and the like described in this embodiment can be combined as appropriate with any of the structures, methods, and the like described in the other embodiments.

Embodiment 5

A semiconductor device having an image sensor function of reading information on an object can be manufactured using the transistor described in any of Embodiments 1 to 3.

Figure 7A:
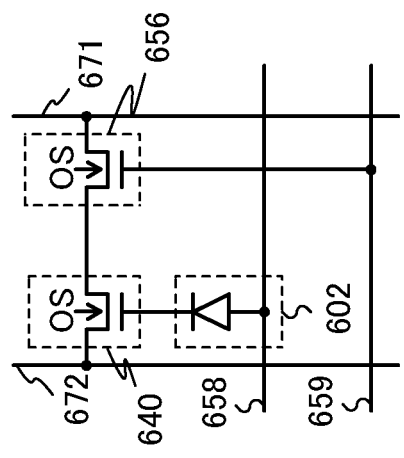
FIGS. 7A and 7B are a circuit diagram and a cross-sectional view, respectively, illustrating an embodiment of a semiconductor device.

FIG. 7A illustrates an example of a semiconductor device having an image sensor function. FIG. 7A is an equivalent circuit diagram of a photosensor, and FIG. 7B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in a circuit diagram in this specification, a transistor including an oxide semiconductor film is denoted by a symbol "OS" so that it can be identified as a transistor including an oxide semiconductor film. In FIG. 7A, the transistor 640 and the transistor 656 are each a transistor including an oxide semiconductor film, to which the transistor described in any of Embodiments 1 to 3 can be applied. Described in this embodiment is an example in which a transistor whose structure and manufacturing method are similar to those of the transistor 440 described in Embodiment 1 is applied.

Figure 7B:
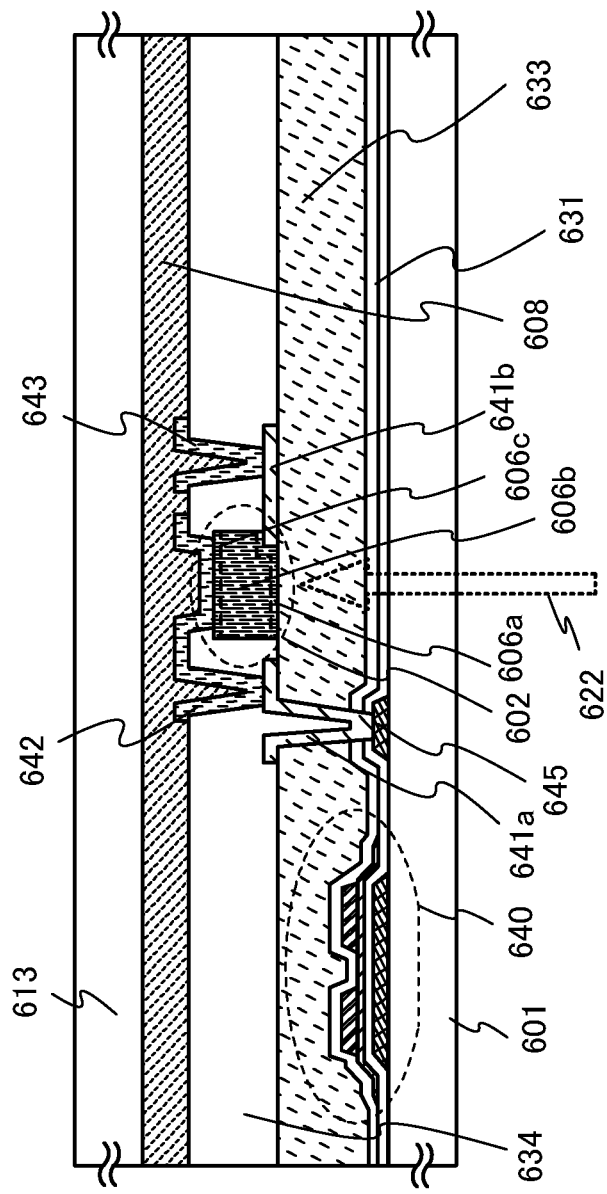

FIG. 7B is a cross-sectional view of the photodiode 602 and the transistor 640 in the photosensor. The transistor 640 and the photodiode 602 functioning as a sensor are provided over a substrate 601 (TFT substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 642 formed over the interlayer insulating film 634 and electrode layers 641a and 641b formed over the interlayer insulating film 633.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to the gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Thus, a pin photodiode has better characteristics when a surface on the p-type semiconductor film side is used as a light-receiving plane. Here, an example in which light that passes through a surface of the substrate 601, over which the pin photodiode is formed, is received and converted into electric signals by the photodiode 602 is described. Further, light from the semiconductor film having a conductivity type opposite to that of the semiconductor film on the light-receiving plane is disturbance light; thus, the electrode layer is preferably formed using a light-blocking conductive film. Note that a surface on the n-type semiconductor film side can alternatively be used as the light-receiving plane.

With the use of an insulating material, the insulating film 631, the interlayer insulating film 633 and the interlayer insulating film 634 can be formed, depending on the material, by a sputtering method, a plasma CVD method, an SOG method, spin coating, dipping, spray coating, a droplet discharge method (such as an inkjet method), a printing method (such as screen printing or offset printing), or the like.

The insulating film 631 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, acrylic resin, a benzocyclobutene-based resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

By detection of light 622 that enters the photodiode 602, information on a detection object can be read. Note that a light source such as a backlight can be used at the time of reading information on a detected object.

In manufacturing the transistor 640 whose structure and manufacturing method are similar to those of the transistor 440 described in Embodiment 1, after the source electrode layer and the drain electrode layer are formed, a step of removing the residue existing on the surface of the oxide semiconductor film and in the vicinity of the surface between the source electrode layer and the drain electrode layer is performed.

Treatment using water or an alkaline solution or plasma treatment can be performed as the residue removal step. For example, treatment using water or a TMAH solution, plasma treatment using oxygen, dinitrogen monoxide, or a rare gas (typically argon), or the like can be favorably used. Alternatively, treatment using dilute hydrofluoric acid may be used.

As described in Embodiment 2, after the formation of the gate electrode layer, the step of removing the residue caused on the surface of the gate electrode layer and in the vicinity of the surface due to the etching step may be performed. Further, as described in Embodiment 3, the step of removing the residue on the surface of the gate electrode layer and in the vicinity of the surface may be performed after the formation of the gate electrode layer, and then the step of removing the residue on the surface of the oxide semiconductor film and in the vicinity of the surface may be performed after the formation of the source and drain electrode layers.

Since the surface of the oxide semiconductor film and the vicinity of the surface can be prevented from being contaminated by the residue, in the transistors 640, the surface density of the impurities due to the etching step (typically halogen (e.g., chlorine, fluorine), boron, phosphorus, aluminum, iron, or carbon) on the surface of the oxide semiconductor film can be $1\times10^{13}$ atoms/cm$^2$ or lower (preferably $1\times10^{12}$ atoms/cm$^2$ or lower). Further, the concentration of the impurities due to the etching step (typically halogen (e.g., chlorine, fluorine), boron, phosphorus, aluminum, iron, or carbon) on the surface of the oxide semiconductor film can be $5\times10^{18}$ atoms/cm$^3$ or lower (preferably $1\times10^{18}$ atoms/cm$^3$ or lower).

Thus, the semiconductor device including the transistor 640 using an oxide semiconductor film and having stable electrical characteristics according to this embodiment can have high reliability. Further, such a highly reliable semiconductor device can be manufactured with a high yield, so that high productivity can be achieved.

The structures, methods, and the like described in this embodiment can be combined as appropriate with any of the structures, methods, and the like described in the other embodiments.

Embodiment 6

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of such electronic devices are illustrated in FIGS. 8A to 8C.

Figure 8A:
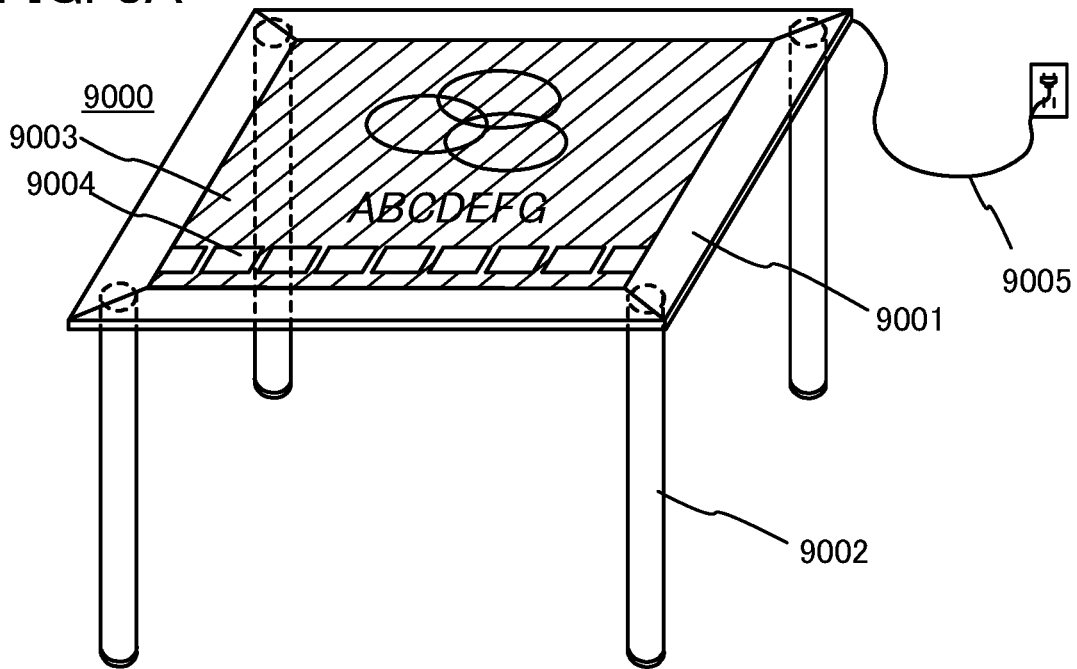
FIGS. 8A to 8C illustrate electronic devices.
Figure 8B:
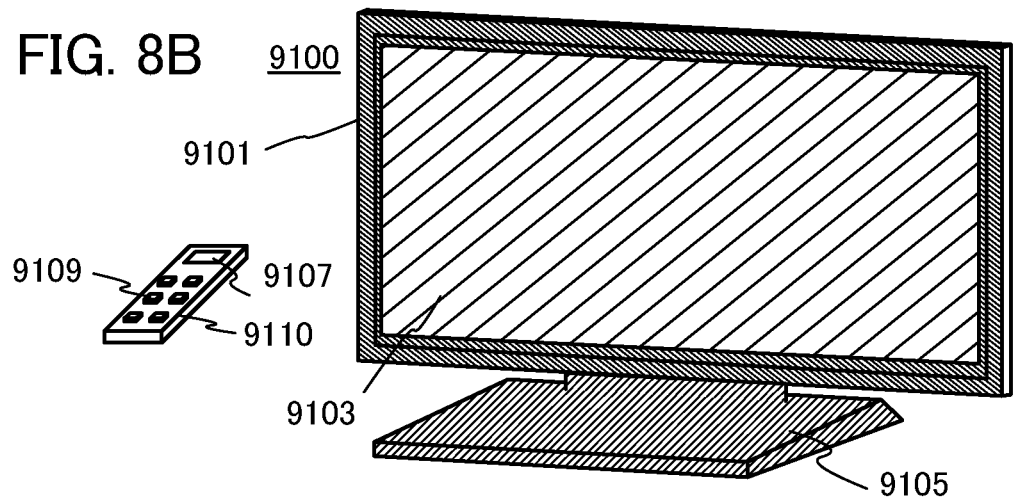
Figure 8C:
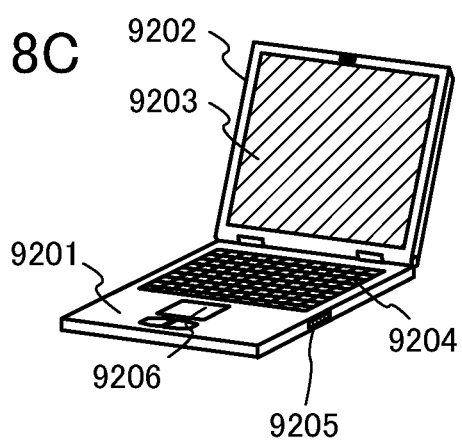

FIG. 8A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The semiconductor device described in any of Embodiments 1 to 5 can be used in the display portion 9003 so that the electronic device can have high reliability.

The display portion 9003 has a touch-input function. When displayed buttons 9004 which are displayed on the display portion 9003 of the table 9000 are touched with his/her finger or the like, operation of the screen and input of information can be carried out. Further, the table 9000 may be made to communicate with home appliances or control the home appliances, so that the table 9000 can function as a control device which controls the home appliances by operation on the screen. For example, with use of the semiconductor device having an image sensing function described in Embodiment 5, the display portion 9003 can have a touch input function.

Further, it is possible to stand the screen of the display portion 9003 so as to be perpendicular to a floor by using a hinge on the housing 9001; thus, the table 9000 can also be used as a television set. When a television set having a large screen is set in a small room, an open space is reduced; however, when a display portion is incorporated in a table, a space in the room can be efficiently used.

FIG. 8B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 8B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

The semiconductor device described in any of Embodiments 1 to 5 can be used in the display portions 9103 and 9107 so that the television set and the remote controller can have high reliability.

FIG. 8C illustrates a computer which includes a main body 9201, a housing 9202, a display portion 9203, a keyboard 9204, an external connection port 9205, a pointing device 9206, and the like.

The semiconductor device described in any of Embodiments 1 to 5 can be used in the display portion 9203, in which case, the computer can have high reliability.

Figure 9A:
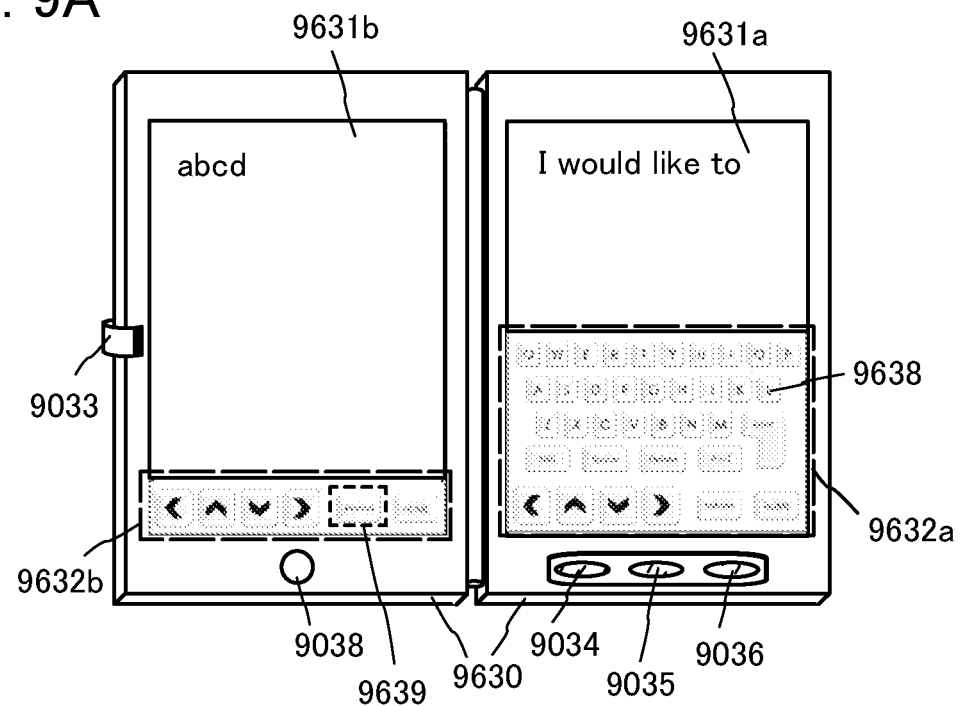
FIGS. 9A to 9C illustrate an electronic device.
Figure 9B:
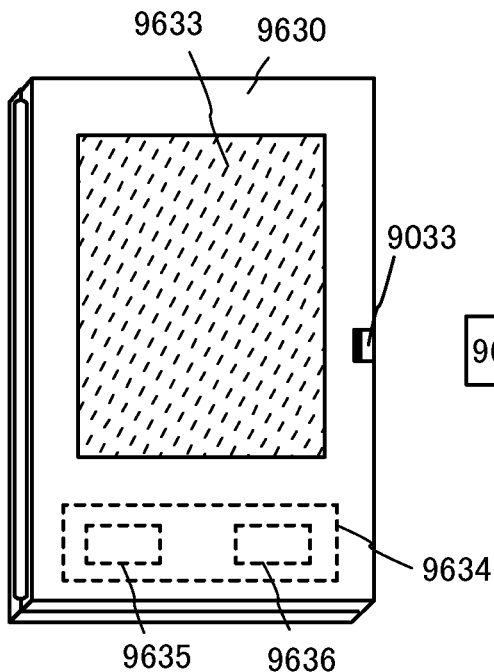

FIGS. 9A and 9B illustrate a tablet terminal that can be folded. In FIG. 9A, the tablet terminal is opened, and includes a housing 9630, a display portion 9631a, a display portion 9631b, a display-mode switch 9034, a power switch 9035, a power-saving-mode switch 9036, a clip 9033, and an operation switch 9038.

The semiconductor device described in any of Embodiments 1 to 5 can be used in the display portion 9631a and the display portion 9631b so that the tablet terminal can have high reliability.

A touch panel area 9632a can be provided in part of the display portion 9631a, in which area, data can be input by touching displayed operation keys 9638. In FIG. 9A, a half of the display portion 9631a has only a display function and the other half has a touch panel function. However, one embodiment of the present invention is not limited to this structure, and the whole display portion 9631a may have a touch panel function. For example, the display portion 9631a can display a keyboard in the whole region to be used as a touch panel, and the display portion 9631b can be used as a display screen.

A touch panel area 9632b can be provided in part of the display portion 9631b like in the display portion 9631a. By touching a keyboard display switching button 9639 displayed on the touch panel with a finger, a stylus, or the like, a keyboard can be displayed on the display portion 9631b.

Touch input can be performed concurrently on the touch panel area 9632a and the touch panel area 9632b.

The display-mode switch 9034 allows switching between a landscape mode and a portrait mode, color display and black-and-white display, and the like. The power-saving-mode switch 9036 allows optimizing the display luminance in accordance with the amount of external light in use which is detected by an optical sensor incorporated in the tablet terminal. In addition to the optical sensor, another detecting device such as a sensor for detecting inclination, like a gyroscope or an acceleration sensor, may be incorporated in the tablet terminal.

Although the display portion 9631a and the display portion 9631b have the same display area in FIG. 9A, one embodiment of the present invention is not limited to this example. The display portion 9631a and the display portion 9631b may have different areas or different display quality. For example, higher definition images may be displayed on one of the display portions 9631a and 9631b.

FIG. 9B illustrates the tablet terminal folded, which includes the housing 9630, a solar battery 9633, a charge and discharge control circuit 9634, a battery 9635, and a DCDC converter 9636. Note that FIG. 9B shows an example in which the charge and discharge control circuit 9634 includes the battery 9635 and the DCDC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 9A and 9B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached to the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium ion battery as the battery 9635 is advantageous in downsizing or the like.

Figure 9C:
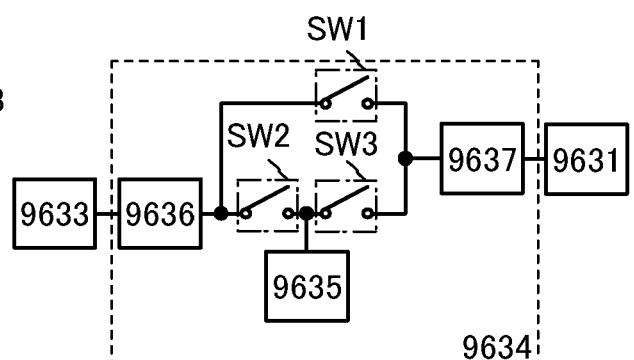

The structure and operation of the charge and discharge control circuit 9634 illustrated in FIG. 9B are described with reference to a block diagram of FIG. 9C. FIG. 9C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 9B.

First, description is given of an example of the operation in the case where power is generated by the solar battery 9633 using external light. The voltage of power generated by the solar battery is raised or lowered by the DCDC converter 9636 so that a voltage for charging the battery 9635 is obtained. When the power from the solar battery 9633 is used for the operation of the display portion 9631, the switch SW1 is turned on and the voltage of the power is raised or lowered by the converter 9637 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

Example 1

This example shows results of a residue removal step performed on a surface of a metal film and a surface of an oxide semiconductor film.

To make samples, an IGZO film with a thickness of 50 nm was formed as an oxide semiconductor film over a silicon substrate by a sputtering method using an oxide target with the following atomic ratio, In:Ga:Zn=3:1:2. Deposition conditions were as follows: an atmosphere of argon and oxygen (argon:oxygen=30 sccm: 15 sccm) was used, the pressure was 0.4 Pa, the power supply was 0.5 kW, and the substrate temperature was 200° C.

Next, the oxide semiconductor film was subjected to etching treatment by a dry etching method (under such etching conditions that an etching gas ($BCl_3$:$Cl_2$=60 sccm: 20 sccm) was used, the ICP power supply was 450 W, the bias power was 100 W, and the pressure was 1.9 Pa). Thus, a sample A-1 was made.

After the etching treatment, water treatment was performed. Thus, a sample A-2 was made.

The IGZO film on which the water treatment was performed was subjected to plasma treatment using oxygen (under such conditions that a gas ($O_2$=300 sccm) was used, the power supply was 1800 W, the pressure was 66.5 Pa, and the treatment time was 3 minutes). Thus, a sample B-1 was made. The IGZO film on which the water treatment was performed was subjected to plasma treatment using dinitrogen monoxide (under such conditions that a gas ($N_2O$=200 sccm) was used, the power supply was 100 W, the power source frequency was 27 MHz, the pressure was 40 Pa, the substrate temperature was 350° C., and the treatment time was 25 minutes). Thus, a sample B-2 was made. The IGZO film on which the water treatment was performed was subjected to treatment using a TMAH solution (under such conditions that the temperature was 50° C. and the treatment time was 60 seconds). Thus, a sample B-3 was made. The IGZO film on which the water treatment was performed was subjected to treatment using an ammonia hydrogen peroxide ($H_2O$:ammonia:hydrogen peroxide=2:2:5) (under such conditions that the temperature was room temperature and the treatment time was 10 seconds). Thus, a sample B-4 was made. The IGZO film on which the water treatment was performed was subjected to plasma treatment using oxygen (under such conditions that a gas ($O_2$=200 sccm) was used, the power supply was 100 W, the power source frequency was 27 MHz, the pressure was 40 Pa, and the substrate temperature was 350° C., and the treatment time was 2 minutes). Thus, a sample B-5 was made. Note that the sample B-1 and the sample B-5 are samples subjected to plasma treatment using oxygen under different treatment conditions.

The surface density of chlorine on film surfaces of the samples A-1, A-2, B-1 to B-5 measured by total reflection X-ray fluorescence spectroscopy is shown in Table 1 and Table 2.

TABLE 1

| Name of Sample | Measurement Film | Treatment | Surface Density of Chlorine (atoms/cm$^2$) | |
|---|---|---|---|---|
| | | | After Deposition | After Treatment |
| A-1 | IGZO | Dry etching treatment | 5.3E+11 | 8.1E+13 |
| A-2 | IGZO | Dry etching treatment + water treatment | 8.8E+11 | 5.9E+12 |

TABLE 2

| Name of Sample | Measurement Film | Residue Removal Step | Surface Density of Chlorine (atoms/cm$^2$) | | |
|---|---|---|---|---|---|
| | | | After Deposition | After Dry Etching Treatment + Water Treatment | After Residue Removal Step |
| B-1 | IGZO | $O_2$ plasma treatment | 8.8E+11 | 5.9E+12 | 1.3E+12 |
| B-2 | IGZO | $N_2O$ plasma treatment | 5.4E+11 | 5.2E+12 | 9.1E+11 |
| B-3 | IGZO | TMAH solution treatment | 2.1E+11 | 4.9E+12 | 2.5E+11 |
| B-4 | IGZO | Ammonia hydrogen peroxide treatment | 2.8E+11 | 4.6E+12 | 4.4E+11 |
| B-5 | IGZO | $O_2$ plasma treatment | 4.7E+11 | 3.7E+12 | 1.2E+12 |

As for the sample A-1 which was not subjected to the residue removal step after the dry etching, the surface density of chlorine on the surface of the IGZO film was largely increased. In contrast, as for the sample A-2 which was subjected to the water treatment after the dry etching, the increase in the surface density of chlorine on the surface of the IGZO film was reduced.

As for the samples B-1 to B-5 which were subjected to the residue removal step such as the plasma treatment using dinitrogen monoxide, the treatment using a TMAH solution, the treatment using an ammonia hydrogen peroxide, or the plasma treatment using oxygen, the surface density of chlorine on the surface of the IGZO film after the residue removal step was equal to or lower than $1 \times 10^{13}$ atoms/cm$^2$. This shows that the residue removal step further removed chlorine and prevented the increase of the surface density of chlorine.

Next, to make different samples, a tungsten (W) film with a thickness of 200 nm was formed over a glass substrate by a sputtering method as a metal film (under such deposition conditions that an argon (80 sccm) atmosphere was used, the pressure was 0.8 Pa, the power supply was 1 kW, and the substrate temperature was 230° C.).

Then, the tungsten film was subjected to etching treatment by a dry etching method (under such etching conditions that an etching gas ($CF_4$:$Cl_2$:$O_2$=25 sccm: 25 sccm: 10 sccm) was used; the ICP power supply was 500 W; the bias power was 100 W; and the pressure was 1.0 Pa) so as to be etched by a thickness of about 50 nm.

After the etching treatment, water treatment was performed.

The tungsten film on which the water treatment was performed was subjected to plasma treatment using oxygen (under such conditions that a gas ($O_2$=300 sccm) was used, the power supply was 1800 W, the pressure was 66.5 Pa, and the treatment time was 3 minutes). Thus, a sample C-1 was made. The tungsten film on which the water treatment was performed was subjected to plasma treatment using dinitrogen monoxide (under such conditions that a gas ($N_2O$=200 sccm) was used, the power supply was 100 W, the power source frequency was 27 MHz, the pressure was 40 Pa, the substrate temperature was 350° C., and the treatment time was 25 minutes). Thus, a sample C-2 was made. The tungsten film on which the water treatment was performed was subjected to treatment using a TMAH solution (under such conditions that the temperature was 50° C. and the treatment time was 60 seconds). Thus, a sample C-3 was made. The tungsten film on which the water treatment was performed was subjected to treatment using an ammonia hydrogen peroxide ($H_2O$:ammonia:hydrogen peroxide=2:2:5) (under such conditions that the temperature was room temperature and the treatment time was 10 seconds). Thus, a sample C-4 was made. The tungsten film on which the water treatment was performed was subjected to plasma treatment using oxygen (under such conditions that a gas ($O_2$=200 sccm) was used, the power supply was 100 W, the power source frequency was 27 MHz, the pressure was 40 Pa, and the substrate temperature was 350° C., and the treatment time was 2 minutes). Thus, a sample C-5 was made. Note that the sample C-1 and the sample C-5 are samples subjected to plasma treatment using oxygen under different treatment conditions.

The surface density of chlorine on film surfaces of the samples C-1 to C-5 measured by total reflection X-ray fluorescence spectroscopy is shown in Table 3.

TABLE 3

| Name of Sample | Measurement Film | Residue Removal Step | Surface Density of Chlorine (atoms/cm$^2$) | | |
|---|---|---|---|---|---|
| | | | After Deposition | After Dry Etching Treatment + Water Treatment | After Residue Removal Step |
| C-1 | W | $O_2$ plasma treatment | 4.0E+11 | 5.2E+12 | 1.3E+12 |
| C-2 | W | $N_2O$ plasma treatment | 6.8E+11 | 5.7E+12 | 6.5E+11 |
| C-3 | W | TMAH solution treatment | 5.2E+11 | 4.3E+12 | 2.2E+12 |
| C-4 | W | Ammonia hydrogen peroxide treatment | 6.8E+11 | 5.2E+12 | 2.3E+12 |
| C-5 | W | $O_2$ plasma treatment | 6.9E+11 | 5.2E+12 | 1.0E+12 |

As for the samples C-1 to C-5 which were subjected to, after the dry etching and the water treatment, the residue removal step such as the plasma treatment using dinitrogen monoxide, the treatment using a TMAH solution, the treatment using an ammonia hydrogen peroxide, or the plasma treatment using oxygen, the surface density of chlorine on the surface of the tungsten film after the residue removal step was equal to or lower than $1\times10^{13}$ atoms/cm$^2$. This shows that the residue removal step removed chlorine and prevented the increase of the surface density of chlorine.

From the above results, the residue removal step such as the water treatment, the plasma treatment using dinitrogen monoxide, the treatment using a TMAH solution, the treatment using an ammonia hydrogen peroxide, or the plasma treatment using oxygen has an effect of reducing the concentration of impurities on the film surface which are caused due to the etching step.

This application is based on Japanese Patent Application serial no. 2011-230126 filed with the Japan Patent Office on Oct. 19, 2011, the entire contents of which are hereby incorporated by reference.

What is claimed is:

1. A semiconductor device comprising:
   a transistor;
   a capacitor electrically connected to the transistor; and
   a light-emitting element electrically connected to the transistor,
   wherein the transistor comprises:
      a first conductive layer functioning as a gate electrode layer over a substrate;
      a first insulating film over the first conductive layer;
      a first oxide semiconductor film comprising a channel formation region;
      a second conductive layer functioning as one of a source electrode and a drain electrode; and
      a third conductive layer functioning as the other of the source electrode and the drain electrode,
   wherein the capacitor comprises a second oxide semiconductor film,
   wherein the semiconductor device further comprises:
      a fourth conductive layer comprising a region in contact with a top surface of the second oxide semiconductor film;
      a fifth conductive layer comprising a region intersecting with the first conductive layer when seen from above;
      a second insulating film over the second conductive layer, the third conductive layer, and the fourth conductive layer; and
      an electrode over and in contact with the second conductive layer through an opening of the second insulating film, the electrode functioning as a pixel electrode of the light-emitting element, and
   wherein the second conductive layer, the third conductive layer, the fourth conductive layer, and the fifth conductive layer comprises the same material, and
   wherein a concentration of one of chlorine and fluorine on a top surface of the gate electrode layer is $5\times10^{18}$ atoms/cm$^3$ or lower.

2. The semiconductor device according to claim 1, wherein the first oxide semiconductor film and the second oxide semiconductor film comprises indium, gallium, and zinc.

3. The semiconductor device according to claim 1, wherein the first conductive layer comprises a stacked-layer structure, and
   wherein the stacked-layer structure comprises a titanium film and a copper film.

4. A semiconductor device comprising:
   a transistor;
   a capacitor electrically connected to the transistor; and
   a light-emitting element electrically connected to the transistor,
   wherein the transistor comprises:
      a first conductive layer functioning as a gate electrode layer over a substrate;
      a first insulating film over the first conductive layer;

a first oxide semiconductor film comprising a channel formation region;

a second conductive layer functioning as one of a source electrode and a drain electrode; and a third conductive layer functioning as the other of the source electrode and the drain electrode, wherein the capacitor comprises a second oxide semiconductor film, wherein the semiconductor device further comprises:
- a fourth conductive layer comprising a region in contact with a top surface of the second oxide semiconductor film;
- a fifth conductive layer comprising a region intersecting with the first conductive layer when seen from above;
- a second insulating film over the second conductive layer, the third conductive layer, and the fourth conductive layer; and
- an electrode over and in contact with the second conductive layer through an opening of the second insulating film, the electrode functioning as a pixel electrode of the light-emitting element, wherein the second conductive layer, the third conductive layer, the fourth conductive layer, and the fifth conductive layer comprises the same material, wherein a concentration of one of chlorine and fluorine on a top surface of the gate electrode layer is $5\times10^{18}$ atoms/cm$^3$ or lower, and wherein a concentration of one of chlorine and fluorine on a top surface of the first oxide semiconductor film is $5\times10^{18}$ atoms/cm$^3$ or lower.

5. The semiconductor device according to claim 4, wherein the first oxide semiconductor film and the second oxide semiconductor film comprises indium, gallium, and zinc.

6. The semiconductor device according to claim 4,
wherein the first conductive layer comprises a stacked-layer structure, and
wherein the stacked-layer structure comprises a titanium film and a copper film.

7. A semiconductor device comprising:
a transistor;
a capacitor electrically connected to the transistor; and
a light-emitting element electrically connected to the transistor, wherein the transistor comprises:
- a first conductive layer functioning as a gate electrode layer over a substrate;
- a first insulating film over the first conductive layer;
- a first oxide semiconductor film comprising a channel formation region;
- a second conductive layer functioning as one of a source electrode and a drain electrode; and
- a third conductive layer functioning as the other of the source electrode and the drain electrode, wherein the capacitor comprises a second oxide semiconductor film, wherein the semiconductor device further comprises:
- a fourth conductive layer comprising a region in contact with a top surface of the second oxide semiconductor film;
- a fifth conductive layer comprising a region intersecting with the first conductive layer when seen from above;
- a second insulating film over the second conductive layer, the third conductive layer, and the fourth conductive layer; and
- an electrode over and in contact with the second conductive layer through an opening of the second insulating film, the electrode functioning as a pixel electrode of the light-emitting element, and wherein the second conductive layer, the third conductive layer, the fourth conductive layer, and the fifth conductive layer comprises the same material.

8. The semiconductor device according to claim 7,
wherein the first oxide semiconductor film and the second oxide semiconductor film comprises indium, gallium, and zinc.

9. The semiconductor device according to claim 7,
wherein the first conductive layer comprises a stacked-layer structure, and
wherein the stacked-layer structure comprises a titanium film and a copper film.

* * * * *